United States Patent
Ikegaya et al.

(10) Patent No.: US 9,608,668 B2
(45) Date of Patent: Mar. 28, 2017

(54) ERROR CORRECTING APPARATUS, ERROR CORRECTING METHOD, AND PROGRAM

(71) Applicant: Sony Corporation, Tokyo (JP)

(72) Inventors: Ryoji Ikegaya, Kanagawa (JP); Tatsuo Shinbashi, Tokyo (JP); Yasushi Fujinami, Tokyo (JP)

(73) Assignee: Sony Corporation, Tokyo (JP)

( * ) Notice: Subject to any disclaimer, the term of this patent is extended or adjusted under 35 U.S.C. 154(b) by 95 days.

(21) Appl. No.: 14/528,555

(22) Filed: Oct. 30, 2014

(65) Prior Publication Data

US 2015/0155885 A1 Jun. 4, 2015

(30) Foreign Application Priority Data

Dec. 2, 2013 (JP) .................................. 2013-249129

(51) Int. Cl.
*H03M 13/00* (2006.01)
*H03M 13/15* (2006.01)

(52) U.S. Cl.
CPC ..... *H03M 13/152* (2013.01); *H03M 13/1535* (2013.01); *H03M 13/1545* (2013.01); *H03M 13/1585* (2013.01); *H03M 13/6502* (2013.01)

(58) Field of Classification Search
CPC ........... H03M 13/152; H03M 13/1535; H03M 13/6502; H03M 13/1585; H03M 13/1545
See application file for complete search history.

(56) References Cited

U.S. PATENT DOCUMENTS

| 2002/0196862 A1* | 12/2002 | Dill ....................... H03M 13/25 375/265 |
| 2006/0277434 A1* | 12/2006 | Tsern .................. G06F 11/1008 714/17 |
| 2010/0251066 A1* | 9/2010 | Radke ................. G06F 11/1068 714/752 |

FOREIGN PATENT DOCUMENTS

JP 2009-212623 A 9/2009

\* cited by examiner

*Primary Examiner* — Guy Lamarre
(74) *Attorney, Agent, or Firm* — Michael Best & Friedrich LLP

(57) ABSTRACT

Provided is an error correcting method including: executing, by an error-position detector, a determination process if a received word fails to satisfy a predetermined condition, the received word having a plurality of symbols, the determination process including determining if a determination-target symbol has an error or not, and detecting an error position, the error position being a position of the symbol having an error; changing, by a determination-target changing unit, the position of the determination-target symbol of the received word every time the determination process is executed; detecting, by an undetected-position detector, if the predetermined condition is satisfied, the error position of the symbol, for which the determination process is not executed, based on a relation between the error position and a variable generated from the received word; and correcting, by an error corrector, an error at the error position detected by the error-position detector and the undetected-position detector.

19 Claims, 28 Drawing Sheets $$\text{Check matrix } H = \begin{bmatrix} 1 & 1 & 1 & \cdots & 1 \\ 1 & A^{1\cdot 1} & A^{1\cdot 2} & \cdots & A^{(n-1)} \\ 1 & A^{2\cdot 1} & A^{2\cdot 2} & \cdots & A^{2(n-1)} \\ \vdots & \vdots & \vdots & \ddots & \vdots \\ 1 & A^{(2t-1)\cdot 1} & A^{(2t-1)\cdot 2} & \cdots & A^{(2t-1)\cdot(n-1)} \end{bmatrix}$$

ERROR CORRECTING APPARATUS, ERROR CORRECTING METHOD, AND PROGRAM

CROSS REFERENCE TO RELATED APPLICATIONS

This application claims the benefit of Japanese Priority Patent Application JP 2013-249129 filed Dec. 12, 2013, the entire contents of which are incorporated herein by reference.

BACKGROUND

The present technology relates to an error correcting apparatus, an error correcting method, and a program. Specifically, the present technology relates to an error correcting apparatus, an error correcting method, and a program, each of which uses an error detection and correction code.

In the past, error detection and correction codes (ECCs) are used in various systems such as broadcast systems, telecommunication systems, and memory systems in order to improve reliability. For example, in a memory system, a memory controller or the like encodes data by using an ECC, stores the encoded data in a memory, and detects and corrects errors of data read based on the ECC.

Here, methods of correcting errors are different depending on the kinds of codes used as ECCs. For example, in a system using a BCH (Bose-Chaudhuri-Hocquenghem) code as an ECC, a decoder generates a vector called a syndrome from a received word having n (n is code length) symbols. Then the decoder generates an error-position polynomial from the syndrome. If it is possible to decode data, the degree of the error-position polynomial is equal to the number of errors (hereinafter referred to as "number-of-errors".) Ne in the received word. Moreover, the power index i of the inverse element $A^i$ of the root $A^{-i}$ of the error-position polynomial represents the position of a symbol having an error out of the n symbols. Note that A is a primitive element of a finite field defining a BCH code, and i is an integer between 0 and n−1. Moreover, the position i of a symbol having an error is called an error position.

The inverse element $A^i$ of the root of an error-position polynomial corresponds to the error position i one-to-one. Because of this, the decoder is capable of detecting an error position by obtaining the root.

If the number-of-errors Ne is equal to or more than three when detecting an error position, the degree of an error-position polynomial is equal to or more than three. Because of this, it is difficult to calculate a root based on an algebraic procedure such as factorization. In view of this, if it is assumed that three or more errors occur, Chien search method is used in general. In Chien search method, candidates of a root corresponding to n symbols, respectively, are substituted into an error-position polynomial in order (for example, see Japanese Patent Application Laid-open no. 2009-212623). If the value of an error-position polynomial is zero when a candidate is substituted, the position, which is represented by the power index i of the inverse element of the candidate, is detected as an error position. In other words, in Chien search method, it is determined if the positions of n symbols are error positions or not in order.

SUMMARY

However, according to the above-mentioned related technology, delay time for error correction may be longer. As described above, in the above-mentioned Chien search method, it is determined if the positions of n symbols are error positions or not in order. Because of this, the time for error correction may be longer as the code length n is larger.

In view of the above-mentioned circumstances, it is desirable to correct errors at a higher speed.

According to a first embodiment of the present technology, there is provided an error correcting apparatus including: an error-position detector configured to execute a determination process if a received word fails to satisfy a predetermined condition, the received word having a plurality of symbols, the determination process including determining if a determination-target symbol has an error or not, and to detect an error position, the error position being a position of the symbol having an error; a determination-target changing unit configured to change the position of the determination-target symbol of the received word every time the determination process is executed; an undetected-position detector configured to detect, if the predetermined condition is satisfied, the error position of the symbol, for which the determination process is not executed, based on a relation between the error position and a variable generated from the received word; and an error corrector configured to correct an error at the error position detected by the error-position detector and the undetected-position detector. Moreover, there is provided an error correcting method, and a program causing a computer to execute the steps of the method. With this configuration, if the predetermined condition is satisfied, the error position of the symbol, for which the determination process is not executed, is detected based on a relation between the error position and a variable generated from the received word, which is effective.

Moreover, according to the first embodiment, the error correcting apparatus may further include a number-of-detection counter configured to count the number-of-detection based on the result of detecting the error position by the error-position detector. The predetermined condition may be the fact that the number-of-detection exceeds a predetermined number. With this configuration, if the number-of-detection exceeds a predetermined number, the error position is detected based on a relation between the error position and a variable generated from the received word, which is effective.

Moreover, according to the first embodiment, the predetermined condition may be the fact that the number of the error position(s) of the symbol(s), for which the determination process is not executed, is less than a predetermined number. With this configuration, if the number of the error position(s) of the symbol(s), for which the determination process is not executed, is less than a predetermined number, the error position is detected based on a relation between the error position and a variable generated from the received word, which is effective.

Moreover, according to the first embodiment, the determination-target changing unit may be configured to determine if the symbol, for which the determination process is not executed, has the error position or not every time the determination process is executed, and to change the position of the determination-target symbol if the symbol has the error position. With this configuration, if the symbol, for which the determination process is not executed, has the error position, the position of the determination-target symbol is changed, which is effective.

Moreover, according to the first embodiment, the error correcting apparatus may further include a number-of-detection counter configured to count the number-of-detection based on a result of detecting an error position by the error-position detector. The predetermined condition may be the fact that the number-of-detection exceeds a predetermined number and the position of the determination-target symbol is within a predetermined range at the same time. With this configuration, if the number-of-detection exceeds a predetermined number and the position of the determination-target symbol is within a predetermined range at the same time, the error position is detected based on a relation between the error position and a variable generated from the received word, which is effective.

Moreover, according to the first embodiment, the predetermined condition may be the fact that the number of the error position(s) of the symbol(s), for which the determination process is not executed, is less than a predetermined number and the position of the determination-target symbol is within the predetermined range at the same time. With this configuration, if the number of the error position(s) of the symbol(s), for which the determination process is not executed, is less than a predetermined number and the position of the determination-target symbol is within the predetermined range at the same time, the error position is detected based on a relation between the error position and a variable generated from the received word, which is effective.

Moreover, according to the first embodiment, the variable may be a coefficient of an error-position polynomial, and the undetected-position detector may be configured to detect the error position based on a predetermined relation between the coefficient and the error position. With this configuration, the error position is detected based on a predetermined relation between the coefficient and the error position, which is effective.

Moreover, according to the first embodiment, the undetected-position detector may be configured to detect the error position, the error position being denoted by x, x corresponding to each of $y_1$ and $y_2$ in the following mathematical formulae $$y=x(P_2/P_1)$$

$$B=(P_0 \cdot P_2)/(P_1)^2$$

$$y_1=(1/Tr(D)) \cdot \{B \cdot D_2+(B+B_2) \cdot D\hat{\,}(2^2)+ \ldots +(B+B\hat{\,}2+ \ldots B\hat{\,}2^{m-2}) \cdot D\hat{\,}(2^{m-1})$$

$$y_2=y_1+1$$

where
C is D where Tr(C)=1 is satisfied in the following mathematical formula $$Tr(C)=C\hat{\,}2^0+C\hat{\,}2^1+ \ldots +C\hat{\,}2^{m-1}, \text{ where}$$

an element of an m-th degree extended field GF($2^m$) of GF(2) is C,
an element of the finite field showing the error position is x,
a coefficient of $x^0$ of the error-position polynomial is $P_0$,
a coefficient of $x^1$ of the error-position polynomial is $P_1$, and
a coefficient of $x^2$ of the error-position polynomial is $P_2$.

With this configuration, the error position is detected, the error position being denoted by x, x corresponding to each of $y_1$ and $y_2$ in the above mathematical formulae, which is effective.

Moreover, according to the first embodiment, the error correcting apparatus may further include: a variable storage configured to store the variable generated from the received word; and a variable updating unit configured to update the variable based on the detected error position every time the error position is detected. With this configuration, every time the error position is detected, the error position is detected based on a relation between the updated variable and the error position, which is effective.

Moreover, according to the first embodiment, the variable updating unit may be configured to update, if the position of the determination-target symbol is within a predetermined range, the variable based on the detected error position every time the error position is detected. With this configuration, if the position of the determination-target symbol is within a predetermined range, the variable is updated every time the error position is detected, which is effective.

Moreover, according to the first embodiment, the variable updating unit may be configured to determine, every time the error position is detected, if the number of the error position of the symbol, for which the determination process is not executed by the error-position detector, is one or not, and to update the variable if the number is not one, and the undetected-position detector is configured to detect, if the number is one, the error position based on a relation between the updated variable and the error position. With this configuration, if the number of the error position of the symbol, for which the determination process is not executed, is not one, the variable is updated. If the number is one, the error position is detected based on a relation between the updated variable and the error position, which is effective.

Moreover, according to the first embodiment, the error correcting apparatus may further include: a syndrome storage configured to store a vector generated from the received word as a syndrome; a syndrome updating unit configured to update the stored syndrome based on the detected error position every time the error position is detected; and a variable generator configured to generate the variable from the stored syndrome, and to supply the variable to the undetected-position detector. With this configuration, every time the error position is detected, the variable is generated from the updated syndrome, which is effective.

Moreover, according to the first embodiment, the error correcting apparatus may further include: a first error-position polynomial generator configured to generate a first error-position polynomial from the received word; a multiplier configured to initialize a second error-position polynomial, and to multiply the second error-position polynomial by a linear polynomial every time the error position is detected, the linear polynomial showing the error position, to thereby update the second error-position polynomial; and a divider configured to divide, if the predetermined condition is satisfied, the first error-position polynomial by the second error-position polynomial, and to supply a coefficient of a polynomial generated by the division to the undetected-position detector as the variable. With this configuration, the second error-position polynomial is multiplied by a linear polynomial every time the error position is detected, the linear polynomial showing the error position, to thereby update the second error-position polynomial. If the predetermined condition is satisfied, the first error-position polynomial is divided by the second error-position polynomial, which is effective.

Moreover, according to the first embodiment, the error correcting apparatus may further include a number-of-errors determining unit configured to detect the error position based on a relation between the error position and the variable generated from the received word, and to determine if the number-of-errors exceeds a predetermined value or not, the number-of-errors being the number of the detected error position(s). The error-position detector may be configured to detect the error position(s) if the number-of-errors exceeds the predetermined value or if the predetermined condition is not satisfied. With this configuration, the error-position detector is configured to detect the error position(s) if the number-of-errors exceeds the predetermined value or if the predetermined condition is not satisfied, which is effective.

Moreover, according to the first embodiment, the error-position detector may be configured to execute the determination process for a plurality of determination-target symbols, and the determination-target changing unit may be configured to change a position of each of the plurality of determination-target symbols every time the determination process is executed for each position of the plurality of determination-target symbols. With this configuration, the determination process is executed for each position of the plurality of determination-target symbols, which is effective.

Moreover, according to the first embodiment, the error correcting apparatus may further include an error value generator configured to generate an error value from the detected error position. The received word may be one of an RS (Reed-Solomon) code, and a received word corresponding to a code word of a BCH code with q $(=2^m)$ unknowns, where m is an integer equal to or more than two, and the error corrector may be configured to correct the error by using the error value at the error position detected by the error-position detector and the undetected-position detector. With this configuration, the error is corrected by using the error value, which is effective.

Moreover, according to the first embodiment, the received word may be a received word corresponding to a code word of a binary BCH (Bose-Chaudhuri-Hocquenghem) code, and the error corrector may be configured to invert a value of the symbol at the error position. With this configuration, the error is corrected by inverting a value of the symbol, which is effective.

According to the present technology, it is possible to correct errors at a high speed, which is very effective. Note that the above-mentioned effects are not necessarily limited. Any effect described in the present disclosure may be obtained.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, embodiments of the present technology will be described with reference to the drawings. Description will be made in the following order.

1. First embodiment (example that error positions are detected by using a mathematical formula if the number-of-detection exceeds a predetermined number)

2. Second embodiment (example that error positions are detected by using a mathematical formula if a syndrome is updated and the number-of-detection exceeds a predetermined number)

3. Third embodiment (example that error positions are detected by using a mathematical formula if the number-of-errors is equal to or less than a predetermined value or if the number-of-detection exceeds a predetermined number)

1. First Embodiment

Example of Configuration of Information Processing System

Figure 1:
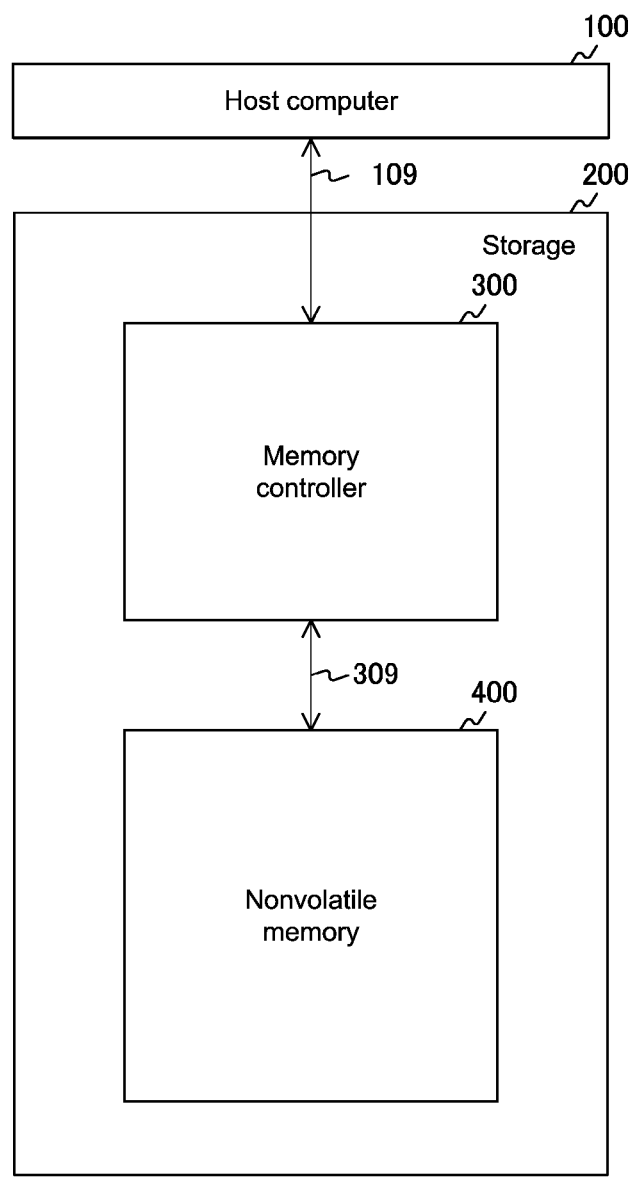
FIG. 1 is a block diagram showing an example of the configuration of an information processing system of a first embodiment.

FIG. 1 is a block diagram showing an example of the configuration of an information processing system of an embodiment. The information processing system includes a host computer 100 and storage 200.

The host computer 100 is configured to control the entire information processing system. Specifically, the host computer 100 generates commands and write-data, and supplies them to the storage 200 via a signal line 109. Moreover, the host computer 100 receives read-data from the storage 200. Here, commands are used to control the storage 200. Examples of the commands include write-commands and read-commands. The write-command instructs to write write-data. The read-command instructs to read read-data.

The storage 200 includes a memory controller 300 and a nonvolatile memory 400. The memory controller 300 is configured to control the nonvolatile memory 400. If the memory controller 300 receives a write-command and write-data from the host computer 100, the memory controller 300 encodes the write-data by using an error detection and correction code (ECC: Error detection and Correction Code). The memory controller 300 accesses the nonvolatile memory 400 via a signal line 309, and writes the encoded data.

Moreover, if the memory controller 300 receives a read-command from the host computer 100, the memory controller 300 accesses the nonvolatile memory 400 via the signal line 309, and reads the encoded data. Then the memory controller 300 converts (i.e., decodes) the encoded data into unencoded data. When decoding, the memory controller 300 detects and corrects errors of the data based on the ECC. Then the memory controller 300 supplies the corrected data to the host computer 100. Note that the memory controller 300 is an example of the claimed error correcting apparatus.

The nonvolatile memory 400 is controlled by the memory controller 300 and configured to store data. For example, the nonvolatile memory 400 is a flash memory.

Note that the nonvolatile memory 400 may not be a flash memory but may be a ReRAM (Resistance Random Access Memory) or a PCRAM (Phase Change Random Access Memory). Alternatively, the nonvolatile memory 400 may not be a flash memory but may be a MRAM (Magnetoresistive Random Access Memory). Moreover, the memory controller 300 stores data in the nonvolatile memory 400. Alternatively, the memory controller 300 may store data in a storage medium or a storage apparatus other than the nonvolatile memory 400 as long as it is a medium or an apparatus capable of storing data. An example of such a storage apparatus is a hard disk drive (HDD).

Moreover, data is encoded and decoded when the host computer 100 accesses the storage medium or the like. Alternatively, a sender apparatus and a receiver apparatus may encode and decode data in a telecommunication system, a broadcast system, or the like.

Example of Configuration of Host Computer

Figure 2:
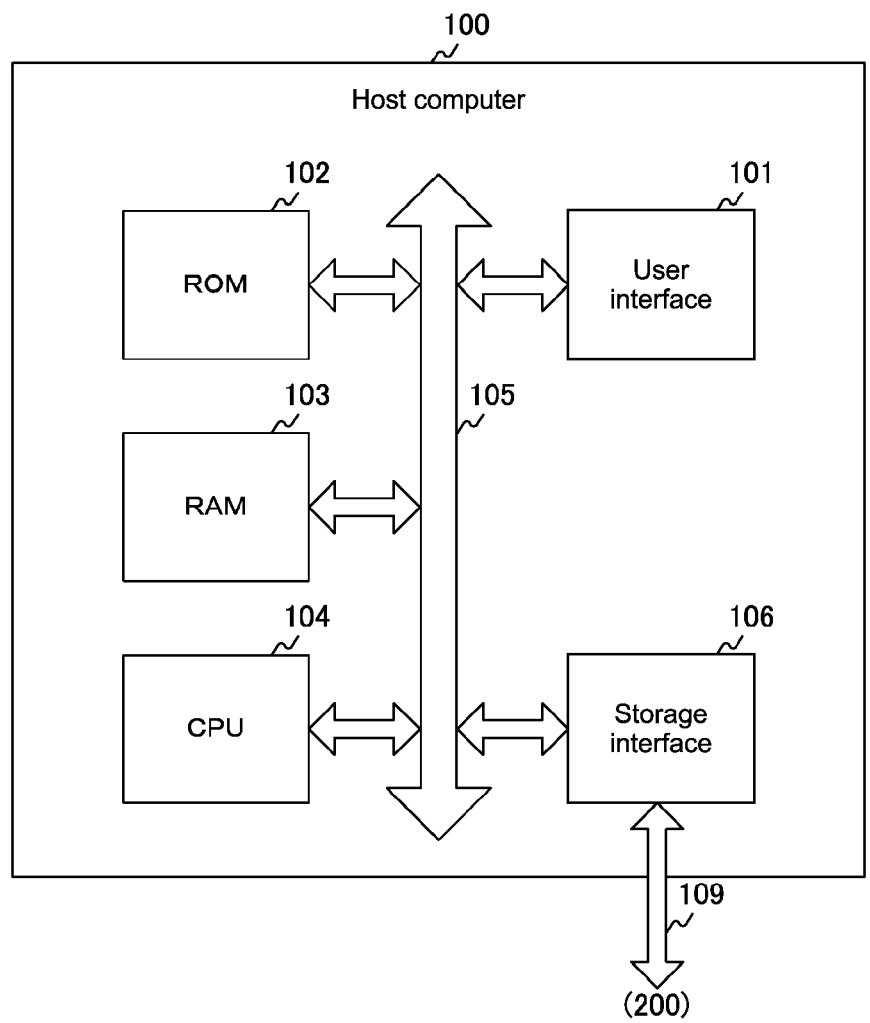
FIG. 2 is a block diagram showing an example of the configuration of a host computer of the first embodiment.

FIG. 2 is a block diagram showing an example of the configuration of the host computer 100 of the first embodiment. The host computer 100 includes a ROM (Read Only Memory) 102, a RAM (Random Access Memory) 103, and a CPU (Central Processing Unit) 104. Moreover, the host computer 100 includes a user interface 101, a bus 105, and a storage interface 106.

The information processing system provides/obtains input data and output data to/from a user via the user interface 101 and vice versa. The ROM 102 is configured to store programs executed by the CPU 104 and other data. The RAM 103 is configured to temporarily store data necessary for the CPU 104 to process information. The CPU 104 is configured to control the entire host computer 100. The bus 105 is a common path through which the user interface 101, the ROM 102, the RAM 103, the CPU 104, and the storage interface 106 exchange data. The storage interface 106 is an interface via which the host computer 100 and the storage 200 exchange data and commands.

Example of Configuration of Memory Controller

Figure 3:
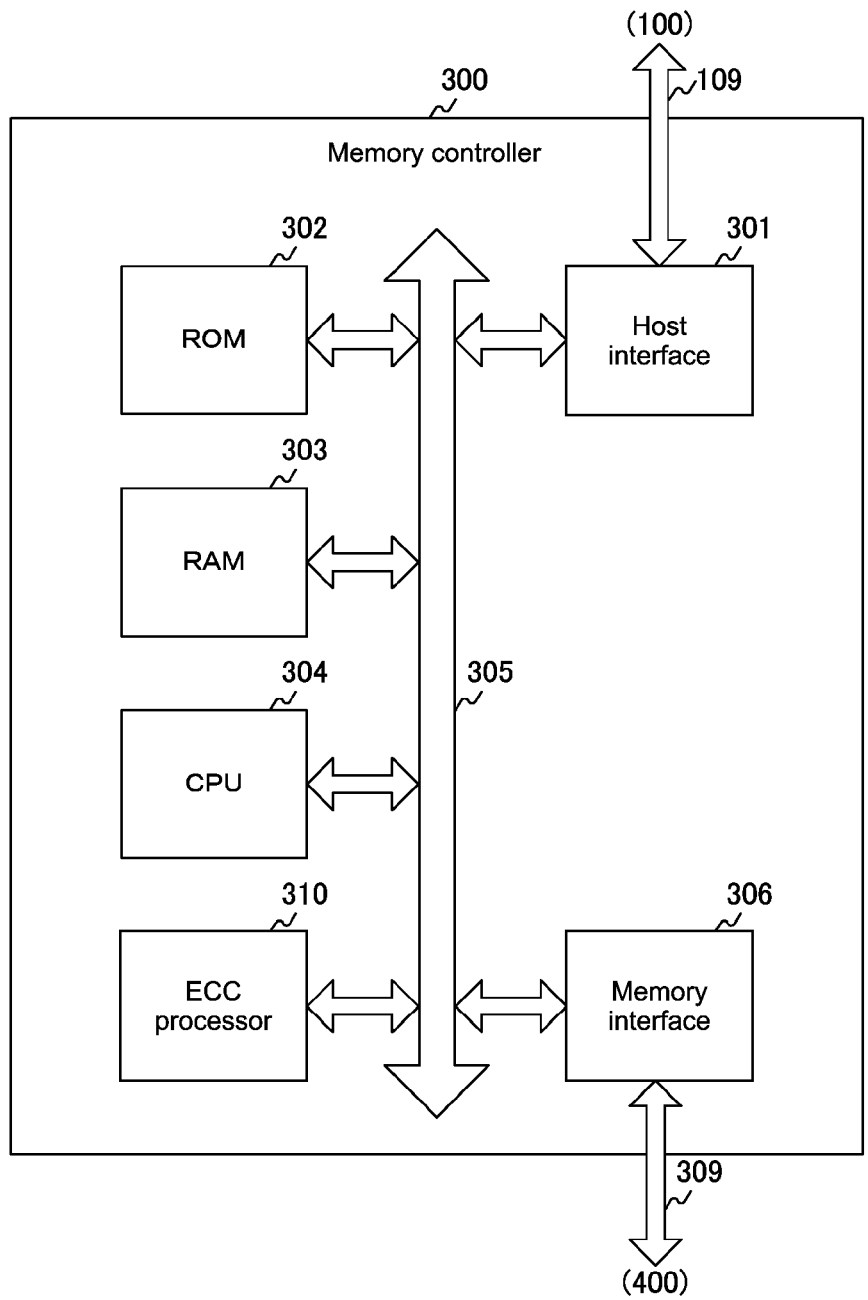
FIG. 3 is a block diagram showing an example of the configuration of a memory controller of the first embodiment.

FIG. 3 is a block diagram showing an example of the configuration of the memory controller 300 of the first embodiment. The memory controller 300 includes a host interface 301, a ROM 302, a RAM 303, a CPU 304, an ECC processor 310, a bus 305, and a nonvolatile memory interface 306.

The memory controller 300 and the host computer 100 exchange data and commands via the host interface 301. The RAM 303 is configured to temporarily store data necessary for the CPU 304 to process information.

The ECC processor 310 is configured to encode write-data and decode read-data. When encoding, the ECC processor 310 encodes each predetermined unit of write-data to thereby obtain an RS (Reed-Solomon) code. Each predetermined unit of encoded data will be hereinafter referred to as a "code word". Each code word has unencoded data and parity. The ECC processor 310 supplies the encoded write-data to the nonvolatile memory 400 via the nonvolatile memory interface 306.

Note that the ECC processor 310 encodes write-data to thereby obtain RS codes. Alternatively, the ECC processor 310 may encode write-data to thereby obtain BCH codes. Moreover, the ECC processor 310 may encode write-data to thereby obtain shortened RS codes or shortened BCH codes. Here, the code length n of a shortened RS code is less than $2^m-1$ (m is an integer equal to or more than 1). The code length n of a shortened BCH code is also less than $2^m-1$.

Moreover, the ECC processor 310 decodes encoded read-data to thereby obtain original data. When decoding, the ECC processor 310 generates an uncorrectable-flag, and supplies the uncorrectable-flag to the host computer 100 via the nonvolatile memory interface 306. The uncorrectable-flag shows if error correction is failed or not. For example, the uncorrectable-flag is on if error correction is failed, and the uncorrectable-flag is off if error correction is successful. Moreover, if error correct is successful, the ECC processor 310 supplies decoded original data to the host computer 100 via the nonvolatile memory interface 306.

The CPU 304 is configured to control the entire memory controller 300. The ROM 302 is configured to store programs executed by the CPU 304 and other data. The bus 305 is a common path through which the host interface 301, the ROM 302, the RAM 303, the CPU 304, the ECC processor 310, and the nonvolatile memory interface 306 exchange data. The memory controller 300 and the nonvolatile memory 400 exchange data and commands via the nonvolatile memory interface 306.

Example of Configuration of ECC Processor

Figure 4:
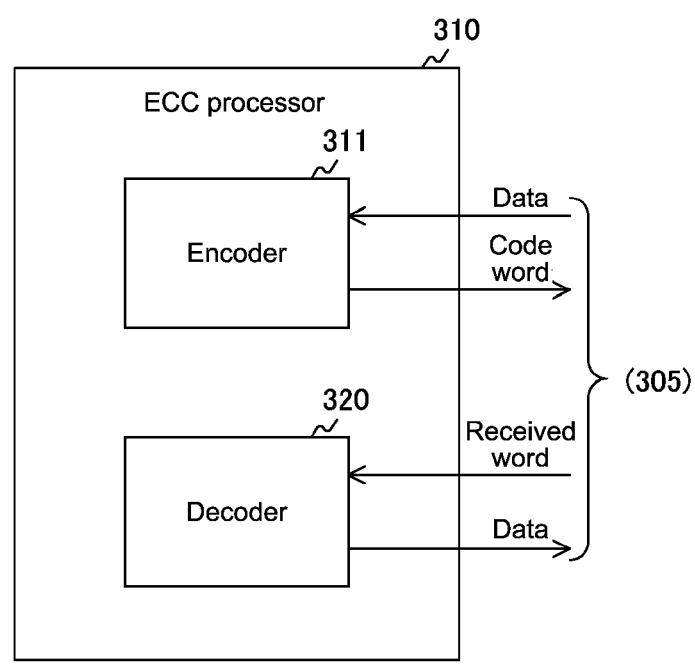
FIG. 4 is a block diagram showing an example of the configuration of an ECC processor of the first embodiment.

FIG. 4 is a block diagram showing an example of the configuration of the ECC processor 310 of the first embodiment. The ECC processor 310 includes an encoder 311 and a decoder 320.

The encoder 311 is configured to encode write-data based on the ECC. The decoder 320 is configured to decode each code-word unit of read-data. When decoding, the decoder 320 obtains a product of a received word and a predetermined check matrix. A vector obtained based on this product is called a syndrome. The decoder 320 detects the position of a symbol having an error, i.e., an error position, based on the generated syndrome. The decoder 320 corrects the error at the error position. The decoder 320 outputs original data including the corrected received word from which parity is removed, i.e., corrected data.

Figures 5A, 5B:
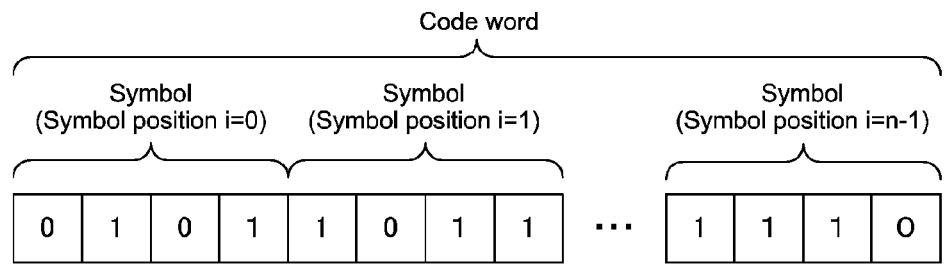
FIGS. 5A and 5B include a diagram showing an example of a code word, and a diagram showing an example of a check matrix of the first embodiment.

FIG. 5 include a diagram showing an example of a code word, and a diagram showing an example of a check matrix of the first embodiment. FIG. 5A is a diagram showing an example of a code word. A code word has n (n is an integer equal to or more than two) symbols. Here, n is called a code length. Moreover, a symbol is data having a predetermined size. A code word has symbols. In an RS code, a symbol is data having a plurality of bits. Note that, in a binary BCH code, a symbol is data of one bit.

FIG. 5B is an example of a check matrix H of the first embodiment. Here, the check matrix H is used in an error-detection process and an error-correction process. A syndrome is generated based on a product of the check matrix H and a received word. The check matrix H of FIG. 5B is used for an RS code. In FIG. 5B, A is a primitive element of a finite field defining an RS code. Moreover, t is an integer, and shows the number of correctable symbols.

Figure 6:
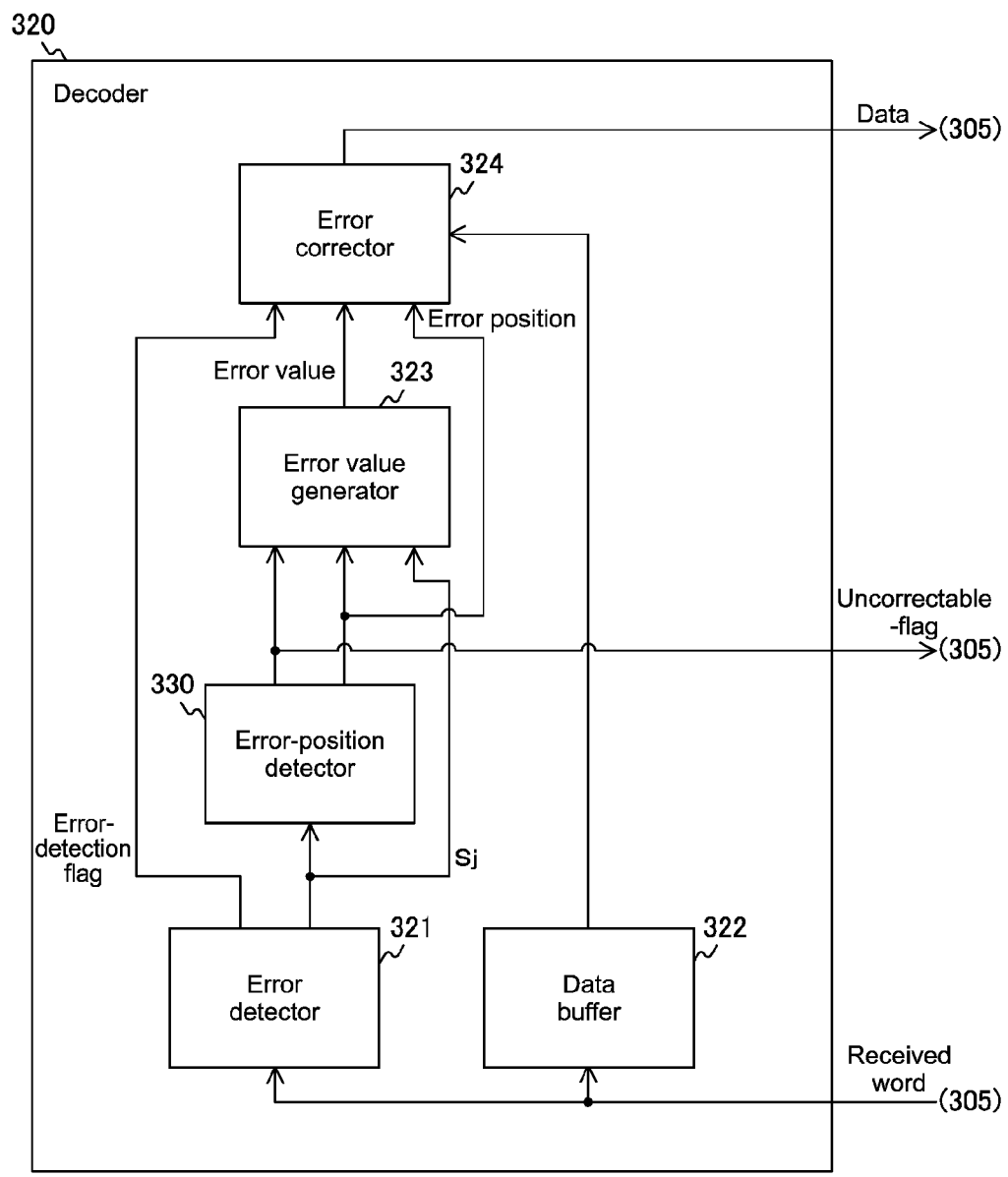
FIG. 6 is a block diagram showing an example of the configuration of a decoder of the first embodiment.

FIG. 6 is a block diagram showing an example of the configuration of the decoder 320 of the first embodiment. The decoder 320 includes an error detector 321, a data buffer 322, an error-position detector 330, an error value generator 323, and an error corrector 324.

The error detector 321 is configured to detect if there are errors or not in a received word. The error detector 321 is configured to receive read read-data, i.e., a received word r, and generates a syndrome s based on the received word r and the check matrix H by using the following mathematical formula.

$$s^T := H \cdot r^T = H(c^T + e^T) = H \cdot e^T \qquad \text{Math. 1}$$

In the above mathematical formula, $s^T$ is a transposed vector of the syndrome s. $r^T$ is a transposed vector of the received word r. $c^T$ is a transposed vector of a code word. $e^T$ is a transposed vector of an error generated in the path from the encoder 311 to the decoder 320. Moreover, ":=" means that the right side defines the left side. The same shall apply in the following mathematical formulae.

Specifically, a component $s_j$ (j is an integer of 0 to 2t−1) of the syndrome s is obtained based on the following mathematical formula.

Math. 2

$$s_j = \sum_{i=0}^{n-1} A^{j \cdot i} e_i = \sum_{a=1}^{N_e} A^{j \cdot i_a} e_{i_a} \qquad \text{式2}$$

A component of each error position of an error vector $e_i$ has a value other than zero, and a component of each of other positions has the value zero. In view of this, if a received word has no error, all the components of the error vector $e_i$ are zero and all the components of the syndrome s are zero based on the mathematical formula 2. In other words, the error detector 321 detects if there are errors or not based on the fact that all the components of the syndrome s are zero or not.

The error detector 321 generates an error-detection flag showing a detection result, and supplies the error-detection flag to the error corrector 324. For example, if a received word has one or more error, the value "1" is set for the error-detection flag. If not, the value "0" is set for the error-detection flag.

Moreover, if a received word has errors, the error detector 321 supplies the syndrome s to the error-position detector 330 and the error value generator 323.

The error-position detector 330 is configured to detect error positions. The error-position detector 330 generates an error-position polynomial P(x) based on the syndrome s by using the Euclidean algorithm, for example. Note that the error-position detector 330 may obtain an error-position polynomial P(x) by using a different algorithm (for example, Peterson algorithm) instead of the Euclidean algorithm.

The Euclidean algorithm is used to obtain an error-position polynomial P(x) of t-th or less and an error evaluation polynomial w(x) of (t−1)-th or less, which satisfy the following mathematical formula and are disjoint, based on the Euclidean mutual division. Here, x is an origin of an element of a finite field.

$$N(x)x^{2t} + P(x)s(x) = w(x) \qquad \text{Math. 3}$$

First, the error-position detector 330 defines a polynomial having $B_{-1}(x)$, $B_0(x)$, $R_{-1}(x)$, and $R_0(x)$ based on the following formulae by using the Euclidean algorithm.

$$B_{-1}(x)=0 \qquad \text{Math. 4}$$

$$B_0(x)=1 \qquad \text{Math. 5}$$

$$R_{-1}(x)=x^{2t} \qquad \text{Math. 6}$$

$$R_0(x)=s(x) \qquad \text{Math. 7}$$

Then the error-position detector 330 sets 1 for a variable k, and divides $R_{k-2}(x)$ by $R_{k-1}(x)$, to thereby obtain a quotient $Q_k(x)$ and a remainder $R_k(x)$. The error-position detector 330 obtains $B_k(x)$ based on those results by using the following mathematical formula.

$$B_k(x)=B_{k-2}(x)-Q_k(x)B_{k-1}(x) \qquad \text{Math. 8}$$

The error-position detector 330 determines if the degree of $R_k(x)$ is less than t (t is the number of correctable symbols) or not. If the degree of $R_k(x)$ is not less than t, the error-position detector 330 increments k by "1", divides $R_{k-2}(x)$ by $R_{k-1}(x)$ again, obtains $B_k(x)$, and determines if the degree of $R_k(x)$ is less than t or not again.

If the degree of $R_k(x)$ is less than t, the error-position detector 330 obtains an error-position polynomial P(x) and an error evaluation polynomial w(x) based on the following mathematical formulae.

$$P(x)=B_k(x)/B_k(0) \qquad \text{Math. 9}$$

$$w(x)=R_k(x)/B_k(0) \qquad \text{Math. 10}$$

The above-mentioned Euclidean algorithm and Peterson algorithm are described in detail for example in "Hideki IMAI, "Code Theory", published by The Institute of Electronics, Information and Communication Engineers, March, 1990, pp. 166 to 173".

The error-position polynomial P(x) obtained by using the mathematical formula 9 may be represented by the following mathematical formula.

Math. 11

$$P(x) = \left(\sum_{a=1}^{N_e} P_a x^a\right) + 1 := \prod_{a=1}^{N_e} (1 - A^{i_a} x)$$

In the above mathematical formula, n is an infinite product. Moreover, $P_a$ is a coefficient of $x^a$ when the right side of the mathematical formula 11 is developed. Note that the coefficient $P_a$ is not a fixed value but changes depending on a received word. Moreover, the degree (i.e., a having the largest value) of the error-position polynomial P(x) is equal to the number-of-errors Ne in the received word. The power index of the primitive element of the inverse element of the root shows an error position. If the number-of-errors Ne, i.e., the degree of the error-position polynomial P(x), is equal to or more than three, it is difficult to obtain the root of the error-position polynomial P(x) by using an algebraic procedure such as factorization.

In view of this, if the number-of-errors Ne is equal to or more than three, the error-position detector 330 substitutes candidates $A^{-i}$ (i is an integer of 0 to n−1) of a root corresponding to a symbol position i into the error-position polynomial P(x) in order, and determines if $P(A^{-i})$ is zero or not.

If $P(A^{-i})$ is zero, the error-position detector 330 detects a symbol position i at that time, i.e., an error position $i_a$, and stores the detected symbol position i. In other words, by substituting the candidates $A^{-i}$, presence/absence of an error in each symbol is determined in order. As described above, candidates of a root are substituted in order whereby an error position is obtained. This algorithm is called Chien search algorithm.

Then, every time the error-position detector 330 detects an error position $i_a$, the error-position detector 330 determines if the difference between the number-of-errors Ne and the number-of-detection b of error positions is equal to or less than a predetermined value (for example, integer of 2 or less) or not. In other words, the error-position detector 330 determines if the number-of-detection b of error positions is equal to or more than a predetermined number (Ne−2) or not. Here, the difference (Ne−b) between the number-of-errors Ne and the number-of-detection b of error positions shows the number of undetected errors. Hereinafter, (Ne−b) will be referred to as "number-of-undetection $Ne^h$".

Moreover, every time the error-position detector 330 detects an error position $i_a$, the error-position detector 330 updates the error-position polynomial P(x) based on the detected error position $i_a$. Specifically, the error-position detector 330 updates the error-position polynomial P(x) with a formula obtained by dividing the error-position polynomial P(x) by $\{x - A^\wedge(-i_a)\}$. As a result, every time an error position $i_a$ is detected, the degree of the error-position polynomial P(x) is decreased, and the number of the degree is the same as the number-of-undetection $Ne^h$.

If the number-of-undetection $Ne^h$ exceeds a predetermined value, the error-position detector 330 continuously detects error positions based on Chien search algorithm.

Meanwhile, if the number-of-undetection $Ne^h$ is equal to or less than a predetermined value, the error-position detector 330 detects error positions based on a predetermined mathematical formula. The predetermined mathematical formula shows the relation between a coefficient and an error position of an error-position polynomial.

Specifically, if the number-of-undetection $Ne^h$ is "1", a linear error-position polynomial $P^h(x)$ represented by the following mathematical formula is obtained by using the mathematical formula 11.

$$P^h(x) = P^h_1 x + P^h_0 \qquad \text{Math. 12}$$

In the above mathematical formula, $P^h_1$ and $P^h_0$ are coefficients of x and $x^0$.

The root x of the mathematical formula 12 is represented by the following mathematical formula.

$$x = -P^h_0 / P^h_1 \qquad \text{Math. 13}$$

Note that if $P^h_0$ and $P^h_1$ are elements of $GF(2^m)$, the root is expressed by using the following mathematical formula.

$$x = P^h_0 / P^h_1 \qquad \text{Math. 14}$$

The power index of the primitive element of the inverse element of the root of each of the mathematical formula 13 and the mathematical formula 14 shows an error position.

Moreover, if the number-of-undetection $Ne^h$ is "2", a quadratic error-position polynomial $P^h(x)$ represented by the following mathematical formula is obtained by using the mathematical formula 3.

$$P^h(x) = P^h_2 x^2 + P^h_1 x + P^h_0 \qquad \text{Math. 15}$$

Note that, in the above mathematical formula, $P^h_2$ is a coefficient of $x^2$ and is a real number other than zero.

Then the error-position detector 330 determines if the coefficient $P^h_1$ of the mathematical formula 15 is zero or not. If the coefficient $P^h_1$ is zero, then the error-position polynomial $P^h(x)$, which is exemplified by the mathematical formula 15, has a multiple root. This result conflicts with the presupposition that the number-of-undetection $Ne^h$ is "2". Such conflict occurs resulting from the fact that a received word has errors and the number-of-errors exceeds the number t of correctable symbols, and other reasons.

As a result, in this case, the error-position detector 330 determines that errors are uncorrectable. The error-position detector 330 generates an uncorrectable-flag based on the determination, and supplies the uncorrectable-flag to the error value generator 323 and the bus 305. The uncorrectable-flag shows if a received word is correctable or not. For example, the value "1" is set if a received word is uncorrectable, and the value "0" is set if a received word is correctable.

If the base field is GF(2), it is not possible to obtain the root of the mathematical formula 15 by using a mathematical formula of a solution to a quadratic equation. In view of this, the error-position detector 330 obtains a root by using a mathematical formula of Hilbert's Theorem.

If $P^h_1$ is not zero, the error-position detector 330 firstly deforms the mathematical formula as shown in the following mathematical formulae where $P^h(x) = 0$ is satisfied. Note that $P^h(x)$ is a quadratic polynomial, and the coefficient $P^h_2$ of $x^2$ is other than zero.

$$P^h(x) = P^h_2 x^2 + P^h_1 x + P^h_0 = 0$$

$$x^2 + (P^h_1 / P^h_2) x + (P^h_0 / P^h_2) = 0 \qquad \text{Math. 16}$$

Here, y and B are defined as shown in the following mathematical formulae.

$$y := x (P^h_2 / P^h_1)$$

$$B := (P^h_0 \cdot P^h_2) / (P^h_1)^2 \qquad \text{Math. 17}$$

Moreover, the mathematical formula 16 is represented by the following mathematical formula, which has y and B defined by the mathematical formula 17.

$$y^2+y+B=0 \qquad \text{Math. 18}$$

Then, the error-position detector 330 determines if the mathematical formula 18 has a root or not by using a trace Tr(C), which is represented by the following mathematical formula.

$$Tr(C)=C^{2^0}+C^{2^1}+\ldots+C^{2^{m-1}} \qquad \text{Math. 19}$$

In the above mathematical formula, C is an element of a finite field $GF(2^m)$. If Tr(B), which is obtained by substituting B of the mathematical formula 17 into the trace Tr(C), is zero, the mathematical formula 9 has a root. If not, the mathematical formula 9 has no root. In view of this, if Tr(B) is not zero, the error-position detector 330 determines that errors are uncorrectable.

If Tr(B) is zero, i.e., if the mathematical formula 9 has a root, the error-position detector 330 obtains D. Here, Tr(D) is "1" in the finite field $GF(2^m)$. The error-position detector 330 detects $y_1$ and $y_2$ based on the following mathematical formulae.

$$y_1:=(1/Tr(D)) \cdot \{B \cdot D^2+(B+B^2) \cdot D^{\hat{}}(2^2)+\ldots+(B+B^{\hat{}}2+\ldots B^{\hat{}}2^{m-2}) \cdot D^{\hat{}}(2^{m-1})\} \qquad \text{Math. 20}$$

$$y_2:=y_1+1 \qquad \text{Math. 21}$$

The mathematical formula 20 and the mathematical formula 21 are derived from Hilbert's Theorem 90. Methods of deriving those formulae and mathematical proof methods of Hilbert's Theorem 90 are described in, for example, "Yukihide TAKAYAMA, "Ring/Field Theory IIGALOIS Theory", URL: http://www.ritsumei.ac.jp/se/~takayama/galois.pdf".

The roots $x_1$ and $x_2$ of the mathematical formula 16 are obtained based on $y_1$, $y_2$, and the mathematical formula 17 by using the following mathematical formulae.

$$x_1:=y_1 \cdot (P^h_1/P^h_2)$$

$$x_2:=y_2 \cdot (P^h_1/P^h_2)=x_1+(P^h_1/P^h_2) \qquad \text{Math. 22}$$

The power indices of the primitive elements of the inverse elements of the roots $x_1$ and $x_2$ of the above mathematical formula are error positions $i_1$ and $i_2$.

The error-position detector 330 supplies error positions and an uncorrectable-flag to the error value generator 323. The error positions are detected by using Chien search process or a mathematical formula (the mathematical formula 13, the mathematical formula 14, or one of the mathematical formula 17 to the mathematical formula 21).

The error value generator 323 is configured to generate an error value of the symbol at a detected error position. The error value generator 323 determines if an error is uncorrectable or not based on the uncorrectable-flag from the error-position detector 330.

If the error is correctable, the error value generator 323 generates an error of a symbol at the error position detected by the error-position detector 330. The generated symbol value is called an error value. For example, the error value generator 323 substitutes the error position into the mathematical formula 2 representing a syndrome, and solves simultaneous equations about an error value, to thereby obtain an error value. The error value generator 323 supplies the generated error value to the error corrector 324. Note that the error value generator 323 may obtain an error value by using the Forney algorithm.

The error corrector 324 is configured to correct errors of a received word. The error corrector 324 determines if there is an error in a received word or not based on an error-detection flag from the error detector 321. If there is no error, the error corrector 324 reads the received word from the data buffer 322, deletes parity, and outputs the received word, i.e., original data. Note that the error corrector 324 deletes parity from the received word, which needs no correction. Alternatively, the error corrector 324 may output a received word, which needs no correction, as it is without deleting parity.

Meanwhile, if there is an error, the error corrector 324 reads the received word from the data buffer 322, and corrects the symbol of the error position of the received word based on an error value. The error corrector 324 deletes parity from the corrected received word, and outputs this corrected received word, i.e., corrected original data. Note that the error corrector 324 deletes parity from the corrected received word. Alternatively, the error corrector 324 may output the corrected received word as it is without deleting parity.

As described above, error-detection by using a mathematical formula (the mathematical formula 13, the mathematical formula 14, or one of the mathematical formula 17 to the mathematical formula 21) is started in the middle of Chien search process. As a result, the calculation amount of detecting error positions is decreased. Specifically, the BCH code is used as the ECC, and a finite field GF (213) is used. Moreover, the size of unencoded data is 4096 bits, and the data size of a code word is 4200 (=4096+13×8) bits.

Now let's assume that error positions are detected only based on Chien search method. In this case, if one position is searched in one clock cycle, 4200 clock cycles pass at a maximum because the data size of a code word is 4200 bits. Even if eight positions are searched in one clock cycle at the same time, 525 (=4200/8) clock cycles pass.

To the contrary, according to the process using a mathematical formula, it is only necessary to calculate an inverse element, a trace Tr, and a root. If an inverse element is calculated by looking up a table, each of an inverse element, a trace Tr, and a root is calculated in one clock cycle. In other words, error positions are detected in three clock cycles. Note that if inverse elements are sequentially calculated without looking up a table, inverse elements are calculated in 28 (=14×2) clock cycles. In this case, error positions are detected in 30 clock cycles. In summary, in the process using a mathematical formula, error positions are detected in 3 or 30 clock cycles.

In view of the above, if the number-of-errors Ne is less than two and only Chien search is used, the error detection delays by 525 or 4200 clock cycles at a maximum. To the contrary, if the number-of-errors Ne is less than two and a mathematical formula is used, the error detection delays only by 3 or 30 clock cycles.

Moreover, even if the number-of-errors Ne is equal to or more than three, the memory controller 300 starts the process using a mathematical formula in the process when the number of residual error positions is equal to or less than two. As a result, it is possible to shorten the delay time. For example, let's assume that there are errors in the 1st bit, the 4199th bit, and the 4200th bit. If Chien search is only executed, the delay time of 525 or 4200 clock cycles occurs. However, if the memory controller 300 detects the error of the 1st bit by using Chien search, then the memory controller 300 starts the process using a mathematical formula, and detects the two residual error positions. So only the delay time of 4 or 31 clock cycles occurs. Hereinafter the above-mentioned process of detecting error positions by using a mathematical formula (the mathematical formula 13, the mathematical formula 14, or one of the mathematical formula 17 to the mathematical formula 21) will be referred to as "mathematical-formula process".

Figure 15:
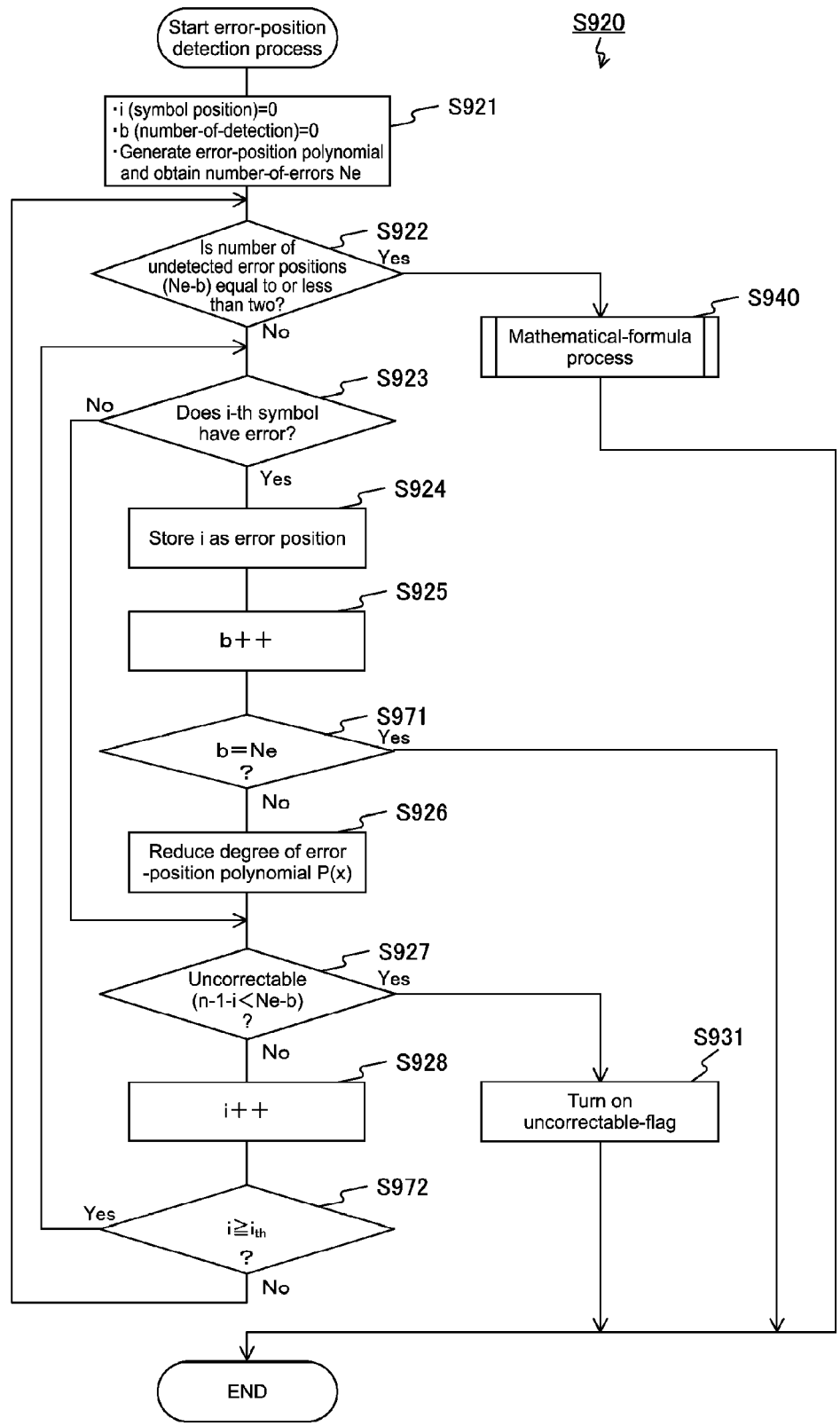
FIG. 15 is a flowchart showing an example of an error-position detection process of a second modification example.

Note that the memory controller 300 starts the mathematical-formula process when the number-of-undetection $Ne^h$ is equal to or less than two. However, the memory controller 300 is preferably configured to start the mathematical-formula process if the number-of-undetection $Ne^h$ is equal to or less than two and the symbol position i is less than a threshold $i_{th}$ at the same time, as described later in a modification example. Here, the error-position detection process finishes faster by continuously performing Chien search process on and after the symbol of the set threshold $i_{th}$ than by starting the mathematical-formula process. In FIG. 15 and thereafter (described later), if the number-of-undetection $Ne^h$ is equal to or less than two and the symbol position i is less than threshold $i_{th}$ (in other words, symbol position i is at a predetermined position) at the same time, the mathematical-formula process is started. The range less than the threshold $i_{th}$ is an example of the claimed predetermined range.

Moreover, the memory controller 300 searches one position for an error position in one clock in Chien search. Alternatively, as described later in the fifth modification example, the memory controller 300 may search for a plurality of symbol positions in one clock.

Moreover, the memory controller 300 is configured to generate an error value. However, if the binary BCH code is used as the ECC, it is not necessary to generate an error value. This is because data of one bit is used as a symbol in the binary BCH code. If the binary BCH code is used, the decoder 320 does not include the error value generator 323, and the error corrector 324 inverts the symbol (bit) at a detected error position to thereby correct an error.

Moreover, if the number-of-undetection $Ne^h$ is equal to or less than two, the memory controller 300 starts the mathematical-formula process using a mathematical formula. Alternatively, if a mathematical formula showing the relation between three or more error positions and coefficients is employed, the memory controller 300 may start the mathematical-formula process using this mathematical formula when the number-of-undetection $Ne^h$ is equal to or less than three.

Example of Configuration of Error-Position Detector

Figure 7:
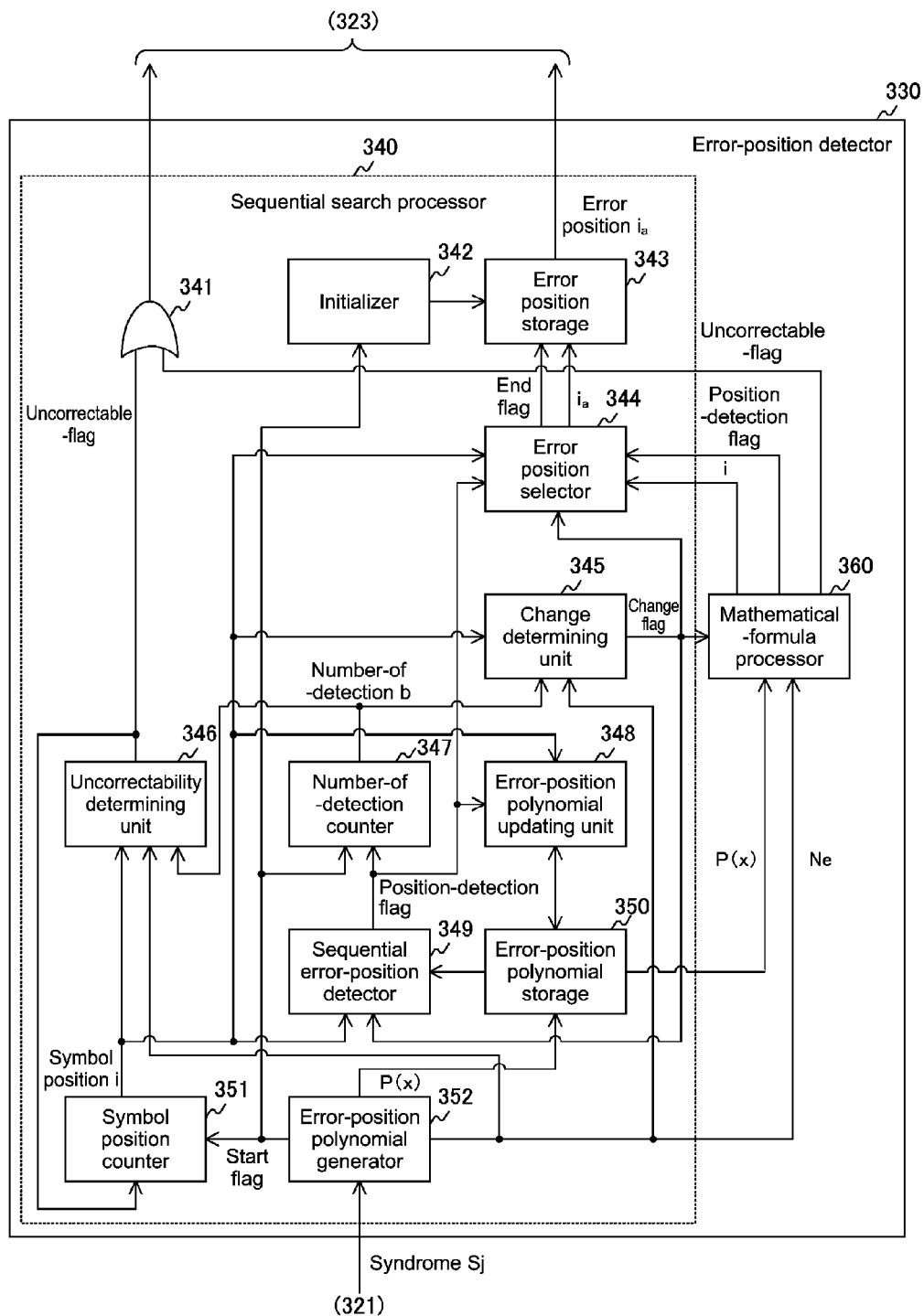
FIG. 7 is a block diagram showing an example of the configuration of an error-position detector of the first embodiment.

FIG. 7 is a block diagram showing an example of the configuration of the error-position detector 330 of the first embodiment. The error-position detector 330 includes a sequential search processor 340 and a mathematical-formula processor 360.

The sequential search processor 340 is configured to search N symbols in order if the positions of the N symbols are error positions or not by using Chien search method. The sequential search processor 340 includes an OR gate 341, an initializer 342, an error position storage 343, an error position selector 344, and a change determining unit 345. The sequential search processor 340 further includes an uncorrectability determining unit 346, a number-of-detection counter 347, an error-position polynomial updating unit 348, a sequential error-position detector 349, an error-position polynomial storage 350, a symbol position counter 351, and an error-position polynomial generator 352.

The error-position polynomial generator 352 is configured to generate an error-position polynomial. The error-position polynomial generator 352 generates an error-position polynomial P(x) by using the Euclidean algorithm or the like. The mathematical formula 11 is an example of the error-position polynomial P(x). In addition, the error-position polynomial generator 352 obtains a number-of-errors Ne. The error-position polynomial generator 352 supplies the number-of-errors Ne to the sequential error-position detector 349, the change determining unit 345, and the mathematical-formula processor 360.

Moreover, the error-position polynomial generator 352 supplies coefficients of the terms of the error-position polynomial P(x) to the error-position polynomial storage 350, and stores the coefficients in the error-position polynomial storage 350. Moreover, if the number-of-errors Ne is equal to or more than three, the error-position polynomial generator 352 generates a start flag, and supplies the start flag to the symbol position counter 351, the number-of-detection counter 347, and the initializer 342. The start flag instructs to start Chien search.

The error-position polynomial storage 350 is configured to store coefficients of the terms of the error-position polynomial P(x). Note that the error-position polynomial storage 350 is an example of the claimed variable storage.

The symbol position counter 351 is configured to count symbol positions. Here, it is determined if a symbol at each symbol position has an error or not. For example, when a start flag is supplied, the symbol position counter 351 changes the symbol position i to an initial value (for example, "0"). Then, if the value of the uncorrectable-flag is "0", the symbol position counter 351 increments the symbol position i by "1" in synchronization with a predetermined clock signal. Meanwhile, if the value of the uncorrectable-flag is "1", the symbol position counter 351 stops counting. The symbol position counter 351 supplies the symbol position i to the uncorrectability determining unit 346, the error position selector 344, the change determining unit 345, the error-position polynomial updating unit 348, and the sequential error-position detector 349.

Every time the symbol position counter 351 counts up the symbol position, a determination-target symbol is changed in a predetermined order. Here, it is determined if the determination-target symbol has an error or not. The symbol position counter 351 is an example of the claimed determination-target changing unit.

The sequential error-position detector 349 is configured to detect if the symbol at the symbol position i, which is supplied from the symbol position counter 351, has an error or not. The sequential error-position detector 349 refers to a change flag.

Here, the change flag shows if Chien search process is to be stopped and the mathematical-formula process is to be started or not. If the mathematical-formula process is to be started, for example, "1" is set for the change flag. If the mathematical-formula process is not to be started, "0" is set for the change flag. Initially "0" is set for the change flag.

If the value of the change flag is "0", the sequential error-position detector 349 obtains coefficients of the terms of the error-position polynomial P(x) from the error-position polynomial storage 350. Then the sequential error-position detector 349 substitutes the error-position polynomial P(x), which is derived from those coefficients, into a candidate of the root corresponding to the symbol position i, and determines if $P(A^{-i})$ is zero or not. If $P(A^{-i})$ is zero, the symbol position i is an error position.

The sequential error-position detector 349 generates a position-detection flag, and supplies the position-detection flag to the number-of-detection counter 347, the error-position polynomial updating unit 348, and the error position selector 344. The position-detection flag shows if the symbol position i is an error position. For example, if the symbol position i is an error position, "1" is set for the position-detection flag. If the symbol position i is not an error position, "0" is set for the position-detection flag. Note that the sequential error-position detector 349 is an example of the claimed error-position detector.

The number-of-detection counter 347 is configured to count the number of detected error positions. When a start flag is supplied, the number-of-detection counter 347 changes the number-of-detection b to an initial value (for example, "0"). Then if the value of the position-detection flag is "1", the number-of-detection counter 347 increments the number-of-detection by "1" in synchronization with a predetermined clock signal. Meanwhile, if the value of the position-detection flag is "0", the number-of-detection counter 347 stops the count operation. The number-of-detection counter 347 supplies the number-of-detection b to the change determining unit 345 and the uncorrectability determining unit 346.

The error-position polynomial updating unit 348 is configured to update the error-position polynomial P(x). If the position-detection flag is "1", the error-position polynomial updating unit 348 obtains coefficients of the terms of the error-position polynomial P(x) from the error-position polynomial storage 350. Then the error-position polynomial updating unit 348 divides the error-position polynomial P(x), which is derived from the coefficients, by $\{x-A^{\wedge}(-i_a)\}$. Here, an error position $i_a$ is the symbol position i where the position-detection flag is "1". The error-position polynomial updating unit 348 updates the error-position polynomial P(x) with the formula obtained by the division. The error-position polynomial updating unit 348 stores the coefficients of the updated error-position polynomial P(x) in the error-position polynomial storage 350.

Note that the error-position polynomial updating unit 348 is an example of the claimed variable updating unit.

The change determining unit 345 is configured to determine if the mathematical-formula process is to be started or not. The change determining unit 345 determines if the number-of-undetection $Ne^h$, i.e., (Ne–b), is more than two or not. Alternatively, the change determining unit 345 determines if the symbol position i is equal to or more than the threshold $i_{th}$ or not. If the number-of-undetection $Ne^h$ is equal to or less than two and the symbol position i is less than the threshold $i_{th}$ at the same time, the change determining unit 345 sets "1" for the change flag to thereby instruct to start the mathematical-formula process. If not, the change determining unit 345 sets "0" for the change flag. The change determining unit 345 supplies the change flag to the sequential error-position detector 349, the error position selector 344, and the mathematical-formula processor 360.

The uncorrectability determining unit 346 is configured to determine if errors of a received word are correctable or not. The uncorrectability determining unit 346 determines if errors are correctable by using the following inequality.

$$(n-1)-i<Ne-b \qquad \text{Math. 23}$$

In the above mathematical formula, the right side represents the number of undetected error positions $Ne^h$. The left side represents the number of undetected symbols. In other words, if the above mathematical formula is satisfied, then it means that the number of undetected symbols is less than the number of undetected error positions $Ne^h$. In this case, even if the sequential error-position detector 349 detects presence/absence of errors of all the undetected symbols, not all the error positions are detected. Because of this, the memory controller 300 is not capable of correcting errors.

Because of this, if the number of undetected symbols is less than the number of undetected error positions $Ne^h$ (i.e., uncorrectable), the uncorrectability determining unit 346 sets the value "1" for the uncorrectable-flag. If not, the uncorrectability determining unit 346 sets the value "0" for the uncorrectable-flag. The uncorrectability determining unit 346 supplies the uncorrectable-flag to the OR gate 341 and the symbol position counter 351.

The mathematical-formula processor 360 is configured to detect undetected error positions by using the above-mentioned mathematical formula (the mathematical formula 13, the mathematical formula 14, or one of the mathematical formula 17 to the mathematical formula 21). If the value of the change flag is "1", the mathematical-formula processor 360 detects error positions by using the mathematical formula. Then, the mathematical-formula processor 360 supplies the position-detection flag, for which "1" is set, and the symbol positions i having errors to the error position selector 344. Moreover, the mathematical-formula processor 360 generates an uncorrectable-flag based on the fact that error positions are detected by using the mathematical formula or not, and supplies the uncorrectable-flag to the OR gate 341. Note that the mathematical-formula processor 360 is an example of the claimed undetected-position detector.

The error position selector 344 is configured to select one of error positions from the sequential error-position detector 349 and error positions from the mathematical-formula processor 360, and to supply the selected error positions. If the value of the change flag is "0", the error position selector 344 selects the symbol position i from the symbol position counter 351, where the position-detection flag from the sequential error-position detector 349 is "1", as an error position $i_a$. Meanwhile, if the value of the change flag is "0", the error position selector 344 selects the symbol position i from the mathematical-formula processor 360, where the position-detection flag from the mathematical-formula processor 360 is "1", as an error position $i_a$. The error position selector 344 supplies the selected error position $i_a$ to the error position storage 343, and stores the selected error position $i_a$ in the error position storage 343. Moreover, if the symbol position i is the latest position (n–1), or if the error position selector 344 receives all the error positions from the mathematical-formula processor 360, the error position selector 344 generates an end flag, and supplies the end flag to the error position storage 343. The end flag shows that detection of error positions is finished.

The error position storage 343 is configured to store error positions. If an end flag is supplied to the error position storage 343, the error position storage 343 supplies the stored error positions i, to the error value generator 323 and the error corrector 324.

The initializer 342 is configured to initialize the error position storage 343. When a start flag is supplied to the initializer 342, the initializer 342 initializes the error position storage 343. For example, the initializer 342 deletes error positions i, stored in the error position storage 343.

the OR gate 341 is configured to supply a logical disjunction of input values. An uncorrectable-flag is input in the OR gate 341 from the uncorrectability determining unit 346. An uncorrectable-flag is further input in the OR gate 341 from the mathematical-formula processor 360. The OR gate 341 supplies the logical disjunction of those uncorrectable-flag values to the error value generator 323.

Example of Configuration of Mathematical Formula Processor

Figure 8:
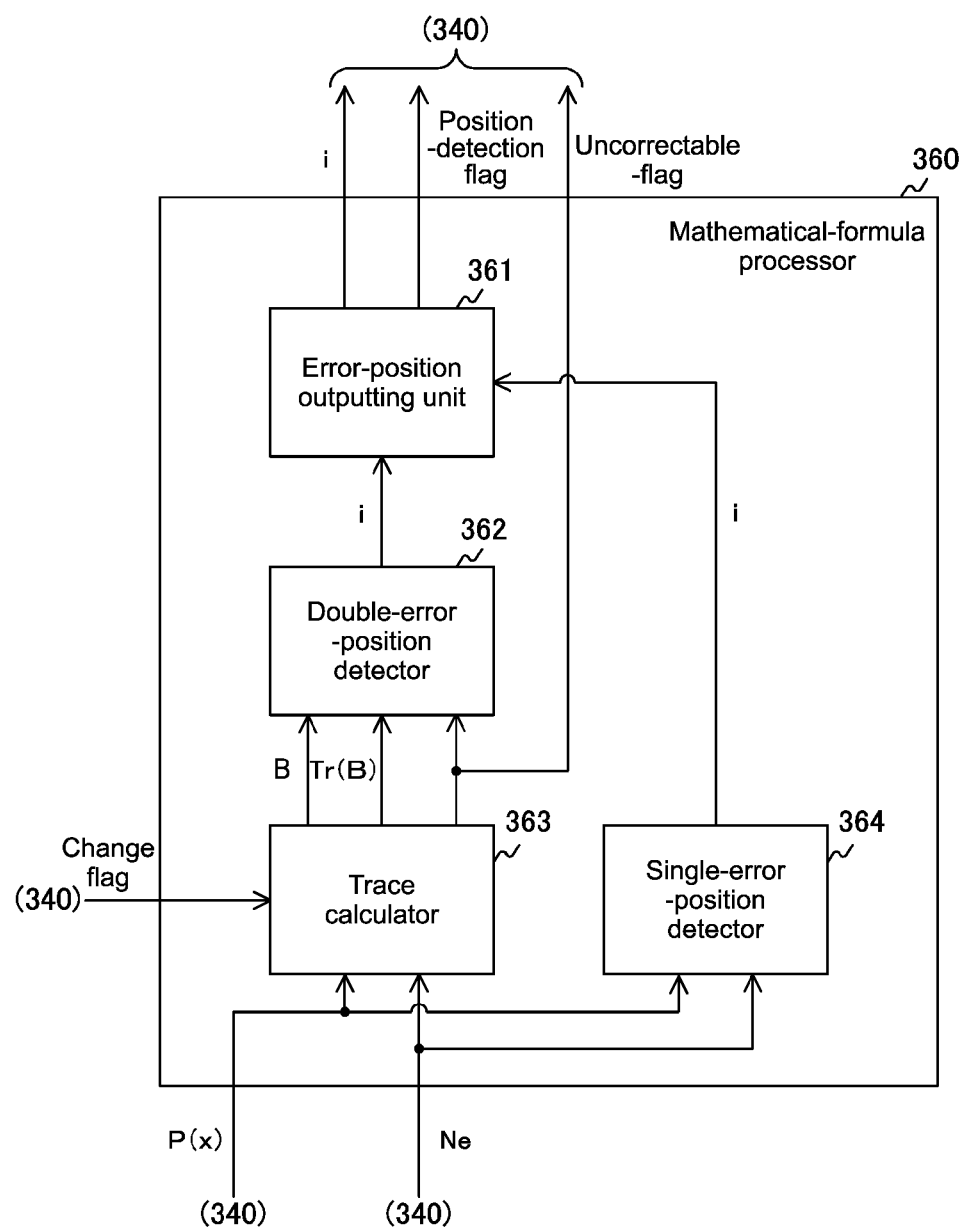
FIG. 8 is a block diagram showing an example of the configuration of a mathematical-formula processor of the first embodiment.

FIG. 8 is a block diagram showing an example of the configuration of the mathematical-formula processor 360 of the first embodiment. The mathematical-formula processor 360 includes an error-position outputting unit 361, a double-error-position detector 362, a trace calculator 363, and a single-error-position detector 364.

The single-error-position detector 364 is configured to detect an error position if the number-of-errors Ne is "1". The single-error-position detector 364 obtains the number-of-errors Ne from the sequential search processor 340, and determines if the obtained value is "1" or not. If the number-of-errors Ne is "1", the single-error-position detector 364 obtains coefficients of the terms of the error-position polynomial P(x) from the sequential search processor 340, and obtains an error position by using the mathematical formula 13 or the mathematical formula 14. The single-error-position detector 364 supplies the obtained error position to the error-position outputting unit 361.

The trace calculator 363 is configured to calculate a trace, and to determine if errors are correctable or not. If the change flag "1" is supplied, the trace calculator 363 determines if the number-of-errors Ne from the sequential search processor 340 is "1" or not. If the number-of-errors Ne is not "1", the trace calculator 363 obtains B by using the mathematical formula 17, and determines if Tr(B) is zero or not by using the mathematical formula 19. If Tr(B) is not zero, i.e., if the error-position polynomial P(x) has no root, the trace calculator 363 sets "1" for the uncorrectable-flag. If Tr(B) is zero, the trace calculator 363 sets "0" for the uncorrectable-flag.

Then, the trace calculator 363 supplies the uncorrectable-flag to the double-error-position detector 362 and the sequential search processor 340, and supplies B and Tr(B) to the double-error-position detector 362.

The double-error-position detector 362 is configured to detect two error positions based on Hilbert's Theorem. If the uncorrectable-flag "0" is supplied, the double-error-position detector 362 obtains two error positions by using the mathematical formula 20 and the mathematical formula 21, and supplies the two error positions to the error-position outputting unit 361.

The error-position outputting unit 361 is configured to output error positions detected by one of the double-error-position detector 362 and the single-error-position detector 364 to the sequential search processor 340. When error positions are supplied from one of the double-error-position detector 362 and the single-error-position detector 364, the error-position outputting unit 361 generates a position-detection flag "1", and supplies the position-detection flag "1" and the error positions to the sequential search processor 340.

Example of Operation of Memory Controller

Figure 9:
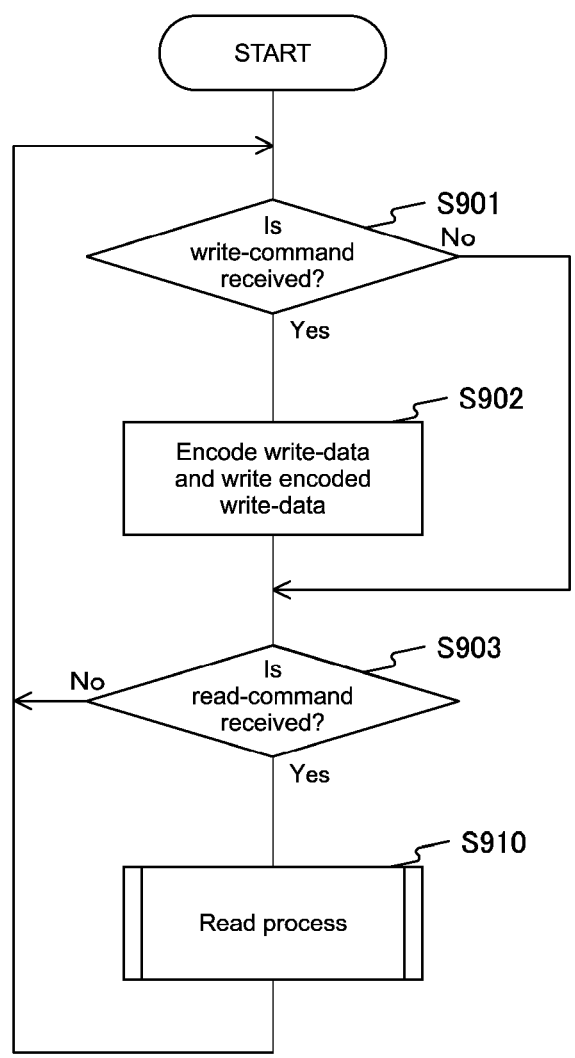
FIG. 9 is a flowchart showing an example of the operation of the memory controller of the first embodiment.

FIG. 9 is a flowchart showing an example of the operation of the memory controller 300 of the first embodiment. For example, the memory controller 300 starts this operation when the memory controller 300 is powered on.

The memory controller 300 determines if it has received a write-command from the host computer 100 or not (Step S901). If the memory controller 300 receives a write-command (Step S901: Yes), the memory controller 300 encodes a write-data, and writes the encoded write-data in the nonvolatile memory 400 (Step S902).

If the memory controller 300 does not receive a write-command (Step S901: No) or after Step S902, the memory controller 300 determines if it has received a read-command from the host computer 100 or not (Step S903). If the memory controller 300 receives a read-command (Step S903: Yes), the memory controller 300 executes read process, i.e., detects and corrects errors in read-data (Step S910). If the memory controller 300 does not receive a read-command (Step S903: No) or after Step S910, the memory controller 300 returns to Step S901.

Figure 10:
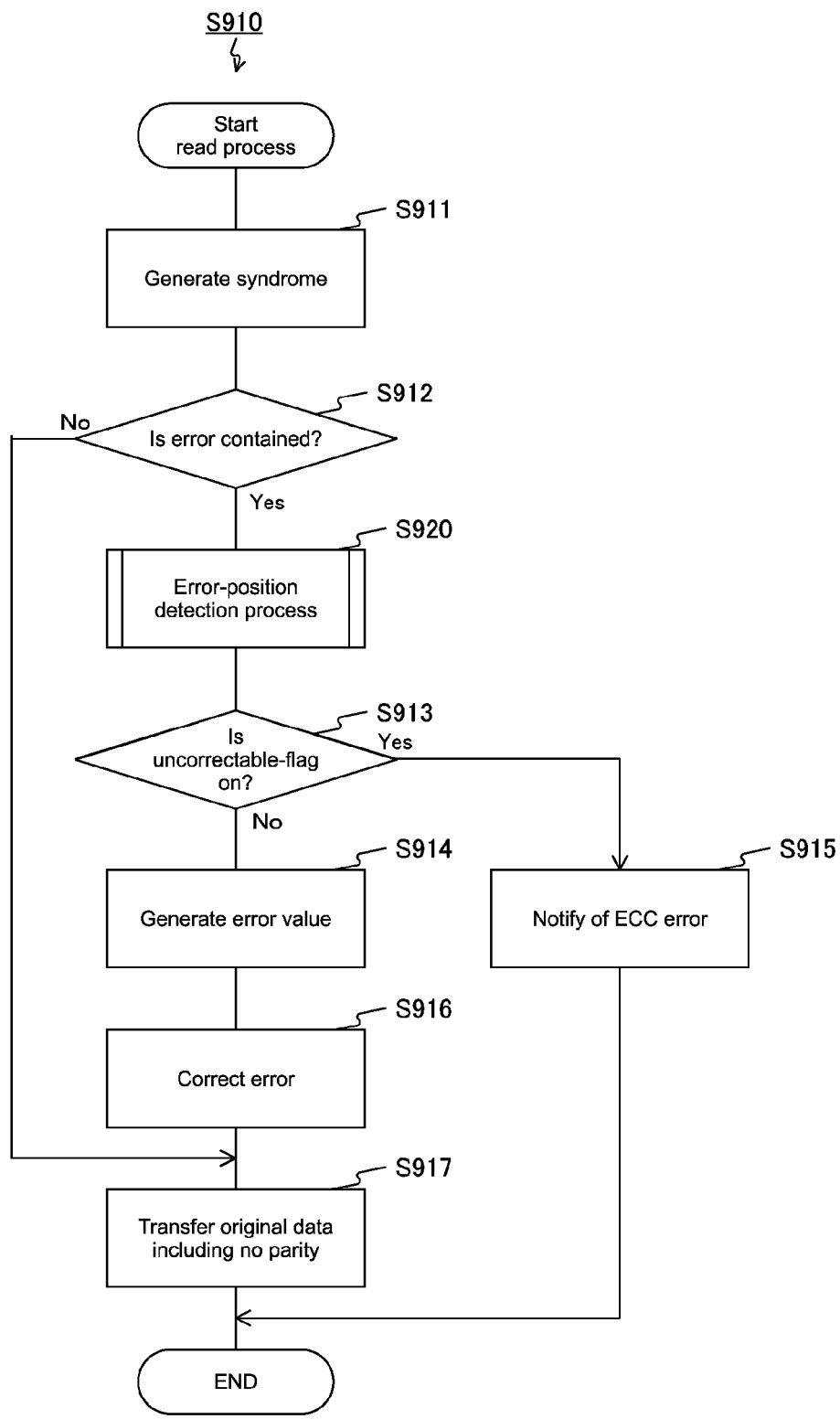
FIG. 10 is a flowchart showing an example of a read process of the first embodiment.

FIG. 10 is a flowchart showing an example of the read process of the first embodiment. The memory controller 300 generates a syndrome based on a received word (Step S911), and determines if the received word has an error or not based on the syndrome (Step S912).

If the received word has an error (Step S912: Yes), the memory controller 300 starts error-position detection process to detect an error position (Step S920). Then the memory controller 300 determines if the value of an uncorrectable-flag is "1" (on) or not (Step S913).

If the uncorrectable-flag is off (Step S913: No), the memory controller 300 generates an error value (Step S914), and corrects the error at the error position based on the error value (Step S916).

Meanwhile, if the uncorrectable-flag is on (Step S913: Yes), the memory controller 300 notifies the host computer 100 of an ECC error (Step S915).

If the received word has no error (Step S912: No) or after Step S916, the memory controller 300 transfers original data, which is obtained by removing parity from the received word, to the host computer 100 (Step S917). After Step S915 or Step S917, the memory controller 300 finishes the read process. Note that in Step S917, the memory controller 300 may output a received word without deleting parity.

Figure 11:
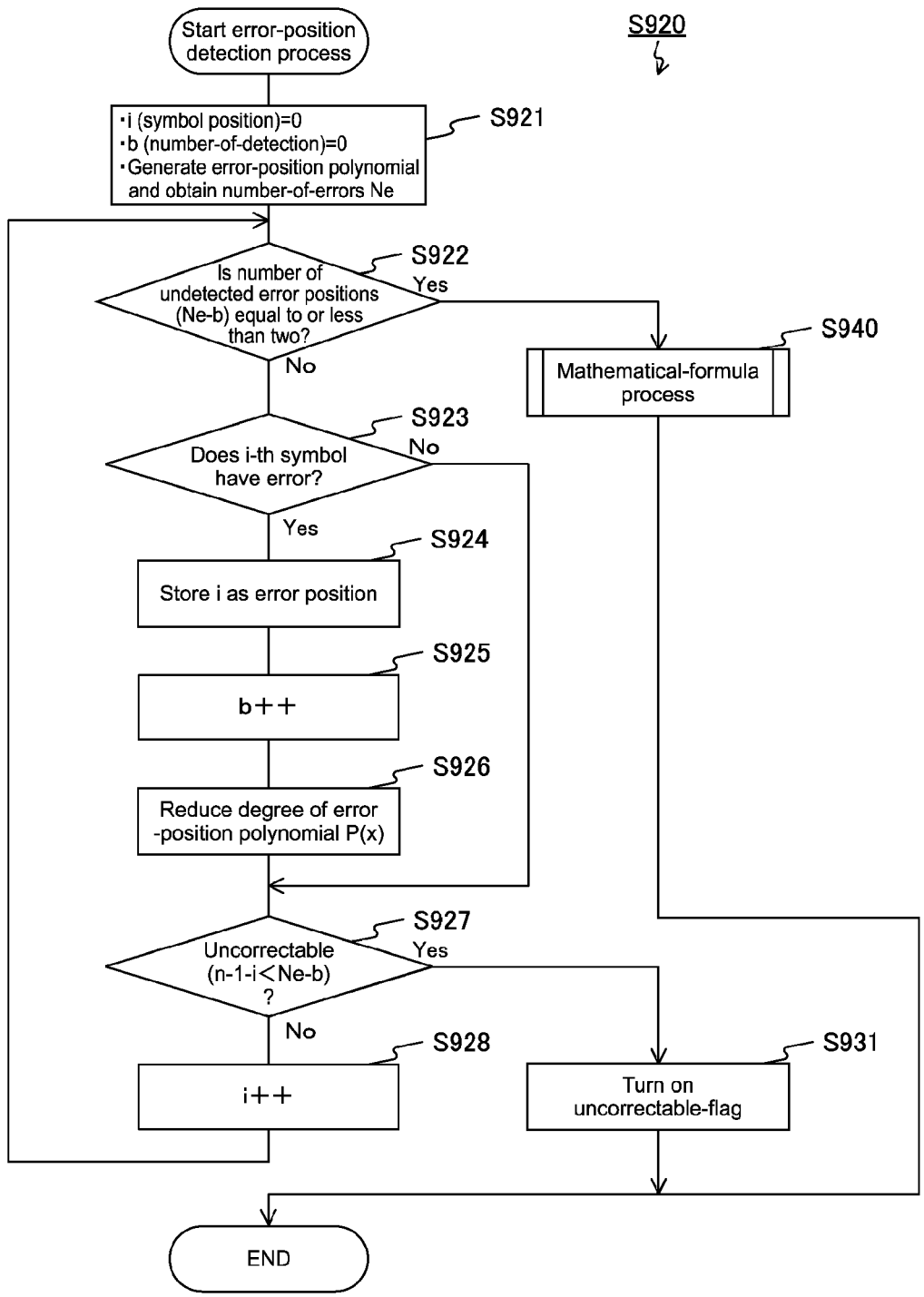
FIG. 11 is a flowchart showing an example of an error-position detection process of the first embodiment.

FIG. 11 is a flowchart showing an example of the error-position detection process of the first embodiment. The memory controller 300 initializes a symbol position i with the initial value "0", initializes a number-of-detection b with the initial value "0", and generates the error-position polynomial P(x). Moreover, the memory controller 300 obtains the degree of the error-position polynomial P(x), i.e., a number-of-errors Ne (Step S921). Then, the memory controller 300 determines if the number of undetected error positions (Ne−b) is equal to or less than two or not (Step S922).

If (Ne−b) is equal to or more than three (Step S922: No), the memory controller 300 substitutes $A^{-1}$ into the error-position polynomial P(x), and determines if the i-th symbol has an error or not (Step S923).

If the i-th symbol has an error (Step S923: Yes), the memory controller 300 stores the i as an error position (Step S924), and increments the number-of-detection b (Step S925). Moreover, the memory controller 300 reduces the degree of the error-position polynomial P(x) based on the error position (Step S926).

If the i-th symbol has no error (Step S923: No) or after Step S926, the memory controller 300 determines if the error is uncorrectable or not based on the fact that the mathematical formula 22 is satisfied or not (Step S927).

If the error is correctable (Step S927: No), the memory controller 300 increments the symbol position i (Step S928), and returns to Step S922.

If the error is uncorrectable (Step S927: Yes), the memory controller 300 turns an uncorrectable-flag on (Step S931). Moreover, if (Ne−b) is equal to or less than two (Step S922: Yes), the memory controller 300 executes the mathematical-formula process to detect an undetected-error-position (Step S940).

After Step S931 or Step S940, the memory controller 300 finishes the error-position detection process.

Figure 12:
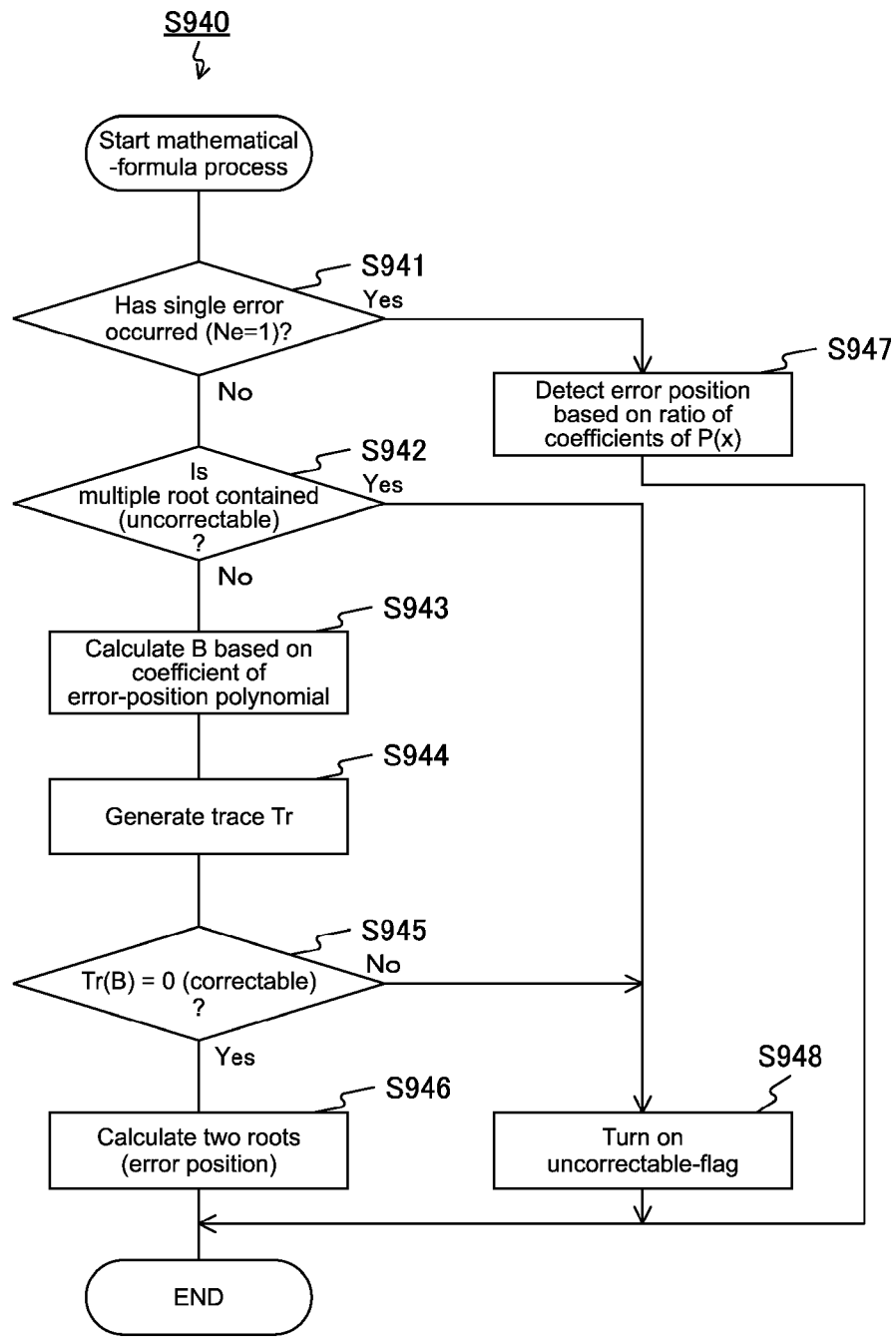
FIG. 12 is a flowchart showing an example of a mathematical-formula process of the first embodiment.

FIG. 12 is a flowchart showing an example of the mathematical-formula process of the first embodiment. The memory controller 300 determines if a single error has occurred (i.e., Ne=1) or not (Step S941). If a single error has not occurred (Step S941: No), the memory controller 300 determines if the error-position polynomial P(x) has a multiple root (i.e., uncorrectable) or not (Step S942).

If the error-position polynomial P(x) does not have a multiple root (Step S942: No), the memory controller 300 calculates B based on the coefficient of the error-position polynomial P(x) by using the mathematical formula 17 (Step S943). Moreover, the memory controller 300 generates a trace Tr (Step S944), and determines if Tr(B) is zero (i.e., correctable) or not (Step S945).

If Tr(B) is zero (Step S945: Yes), the memory controller 300 calculates an error position based on two roots by using the mathematical formula 20 and the mathematical formula 21 (Step S946).

If a single error occurs (Step S941: Yes), the memory controller 300 detects an error position based on the ratio of the coefficients of P(x) (Step S947). Each of the mathematical formula 13 and the mathematical formula 14 is an example of the ratio of the coefficients of P(x). If the error-position polynomial P(x) has a multiple root (Step S942: Yes) or if Tr(B) is not zero (Step S945: No), the memory controller 300 turns the uncorrectable-flag on (Step S948). After Step S946, S947, or S948, the memory controller 300 finishes the mathematical-formula process.

As described above, according to the first embodiment of the present technology, if a predetermined condition is satisfied in Chien search, the decoder 320 detects error positions by using a mathematical formula, which shows the relation between an error position and a variable. So it is possible to detect error positions faster than a method using the mathematical formula. As a result, the decoder 320 is capable of correcting errors at a higher speed.

First Modification Example

In the first embodiment, the memory controller 300 reduces the degree of the error-position polynomial P(x) every time an error position is detected. Alternatively, this process may not be executed. If the degree of the error-position polynomial is not reduced, it is necessary for the memory controller 300 to generate an error-position polynomial P(x), whose degree is reduced, after the mathematical-formula process is started. According to the first modification example, the memory controller 300 generates an error-position polynomial P(x), whose degree is reduced, after the mathematical-formula process is started. This is different from the first embodiment.

Example of Configuration of Error-Position Detector

Figure 13:
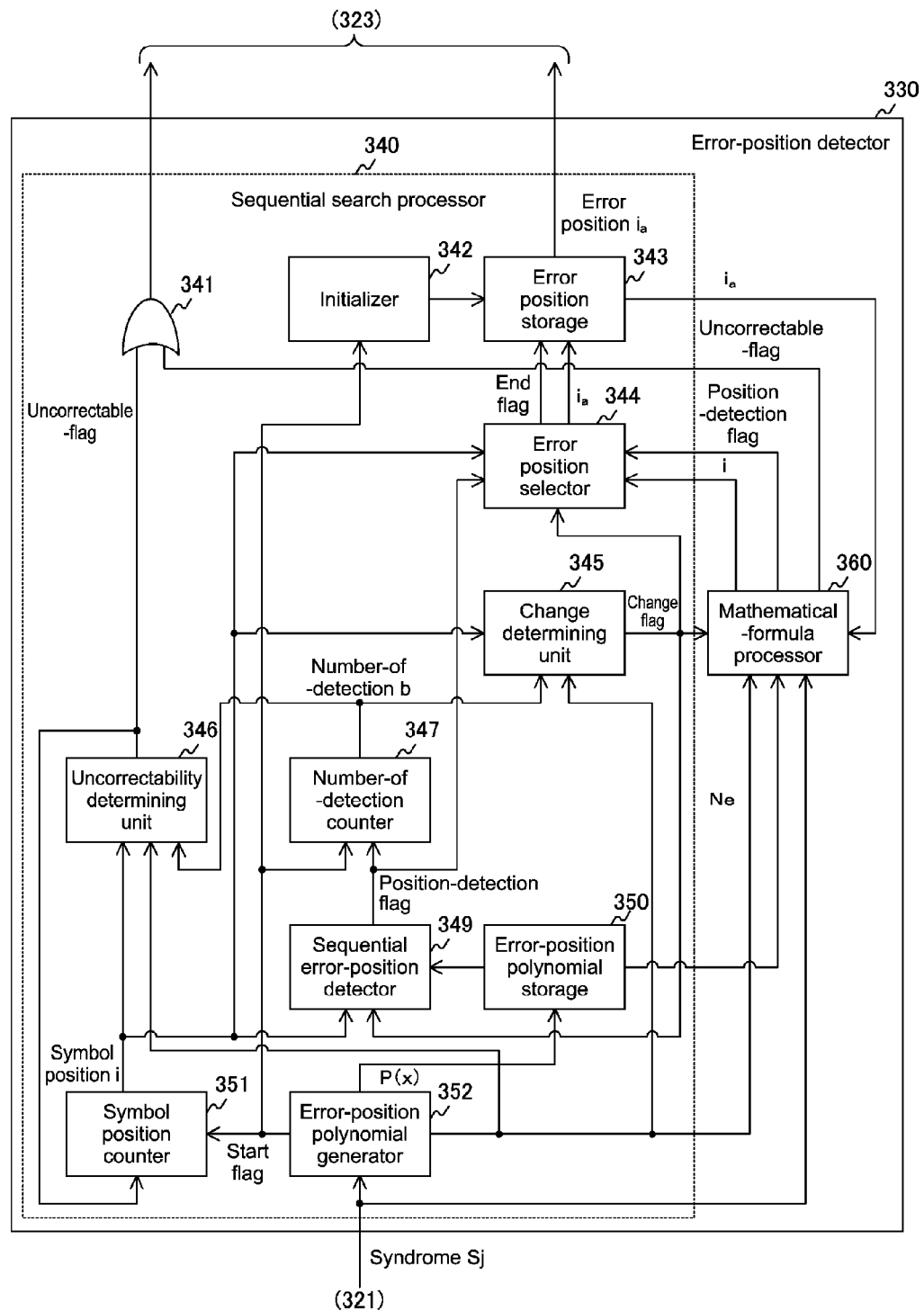
FIG. 13 is a block diagram showing an example of the configuration of an error-position detector of a first modification example.

FIG. 13 is a block diagram showing an example of the configuration of the error-position detector 330 of the first modification example. The error-position detector 330 of the first modification example is different from that of the first embodiment in that it does not include the error-position polynomial updating unit 348.

Figure 14:
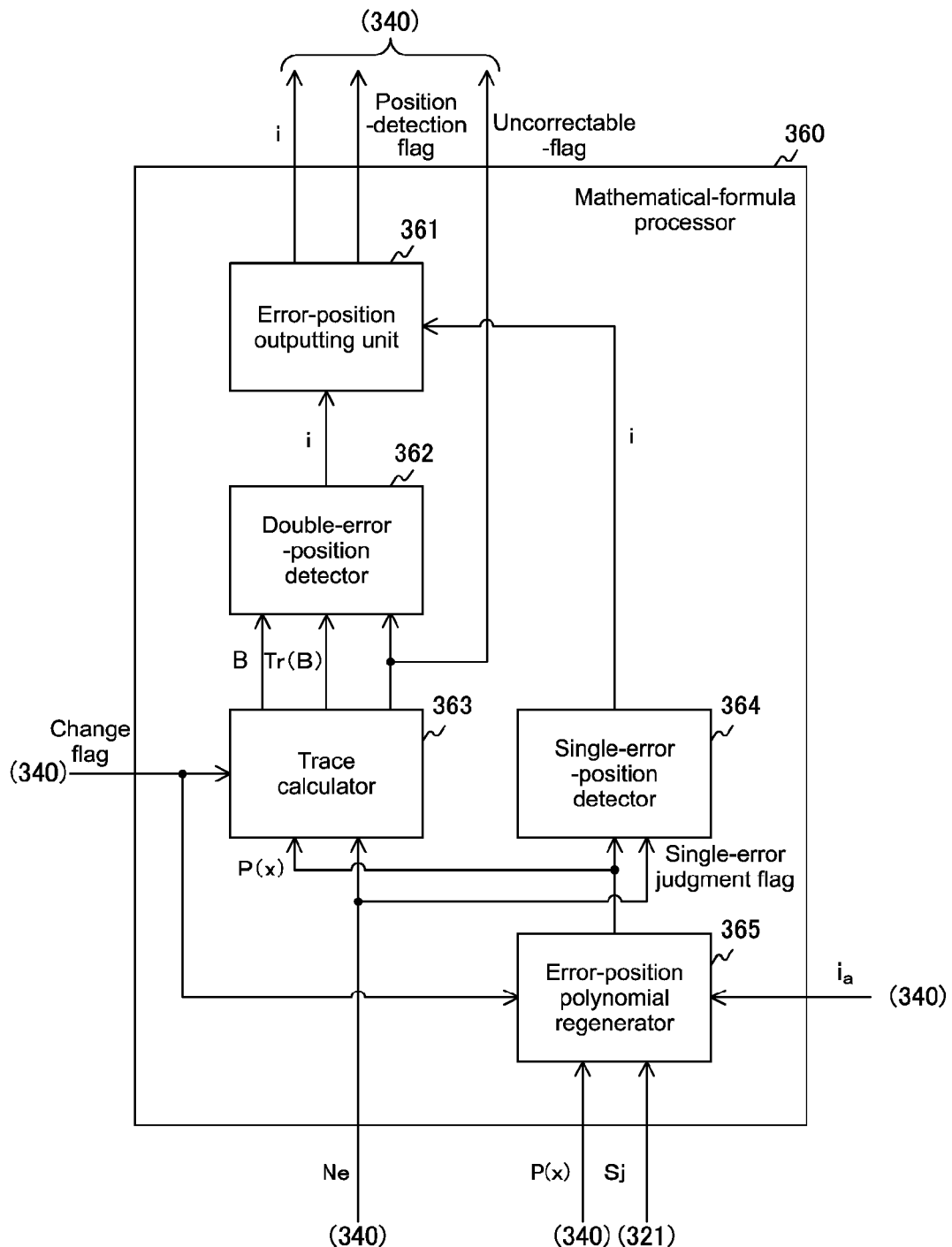
FIG. 14 is a block diagram showing an example of the configuration of a mathematical-formula processor of the first modification example.

FIG. 14 is a block diagram showing an example of the configuration of the mathematical-formula processor 360 of the first modification example. The mathematical-formula processor 360 of the first embodiment in that it further includes an error-position polynomial regenerator 365.

The error-position polynomial regenerator 365 is configured to generate an error-position polynomial P(x), whose degree is reduced, when the mathematical-formula process is started. If the value of the change flag is "1", the error-position polynomial regenerator 365 obtains detected error positions i, from the error position storage 343, and obtains the coefficients of the error-position polynomial P(x) from the error-position polynomial storage 350. Moreover, the error-position polynomial regenerator 365 obtains a syndrome s from the error detector 321.

If no error position $i_a$ is detected at all, the number-of-errors Ne is "1". In this case, the error-position polynomial regenerator 365 generates an error-position polynomial, whose degree is "1", from the syndrome s.

Meanwhile, if the number of the error positions i, is equal to or more than one, the number-of-errors Ne is "2". In this case, the error-position polynomial regenerator 365 divides the error-position polynomial P(x) of each error position $i_a$ by $\{x-A^{\wedge}(-i_a)\}$, to thereby generate the error-position polynomial P(x) whose degree is "2".

The error-position polynomial regenerator 365 supplies the coefficients of the terms of the generated error-position polynomial P(x) to the trace calculator 363 and the single-error-position detector 364.

As described above, according to the first modification example, the mathematical-formula processor 360 updates the error-position polynomial after the mathematical-formula process is started. So it is not necessary for the sequential search processor 340 to update an error-position polynomial in Chien search before the mathematical-formula process is started. Because of this, it is not necessary to provide a circuit or a program configured to update an error-position polynomial. The sequential search processor 340 with a simple configuration is attained.

Second Modification Example

In the first embodiment, the memory controller 300 does not determine if the number-of-detection b reaches the number-of-errors Ne or not. Alternatively, the memory controller 300 may determine if the number-of-detection b reaches the number-of-errors Ne or not, and may finish the error-position detection process when the number-of-detection b reaches the number-of-errors Ne. The error-position detector 330 of the second modification example is different from that of the first embodiment in that it determines if the number-of-detection b reaches the number-of-errors Ne or not.

FIG. 15 is a flowchart showing an example of the error-position detection process of the second modification example. The error-position detection process of the second modification example is different from that of the first embodiment in that it further includes Steps S971 and S972.

The memory controller 300 increments the number-of-detection b (Step S925), and determines if the number-of-detection b is equal to the number-of-errors Ne or not (Step S971). If the number-of-detection b is equal to the number-of-errors Ne (Step S971: Yes), the memory controller 300 finishes the error-position detection process. Meanwhile, if the number-of-detection b is different from the number-of-errors Ne (Step S971: No), the memory controller 300 executes Step S926. Then, after Step S928, the memory controller 300 determines if the symbol position i is equal to or more than the threshold $i_{th}$ or not (Step S972). Here, the error-position detection process finishes faster by continuously performing Chien search process on and after the symbol of the set threshold $i_{th}$ than by starting the mathematical-formula process. If the symbol position i is equal to or more than the threshold $i_{th}$ (Step S972: Yes), the memory controller 300 returns to Step S923. Meanwhile, if the symbol position i is less than the threshold $i_{th}$ (Step S972: No), the memory controller 300 returns to Step S922.

Note that the memory controller 300 may not execute Step S971 in another configuration. In this configuration, if the symbol position i is equal to or more than the threshold $i_{th}$ (Step S972: Yes), the memory controller 300 may determine if i is equal to n or not. Then, if i is equal to n, the memory controller 300 finishes the error-position detection process. If not, the memory controller 300 returns to Step S923.

As described above, according to the second modification example, the error-position detection process is finished when all the error positions are detected. The time required for the error-position detection process is further reduced.

Third Modification Example

In the first embodiment, the memory controller 300 reduces a degree of an error-position polynomial every time the memory controller 300 detects an error position. Alternatively, in another configuration, the memory controller 300 may not reduce a degree even if the memory controller 300 detects an error position on and after a predetermined position. The error-position detector 330 of the third modification example is different from the first embodiment in that it does not reduce a degree even if it detects an error position on and after a predetermined position.

Figure 16:
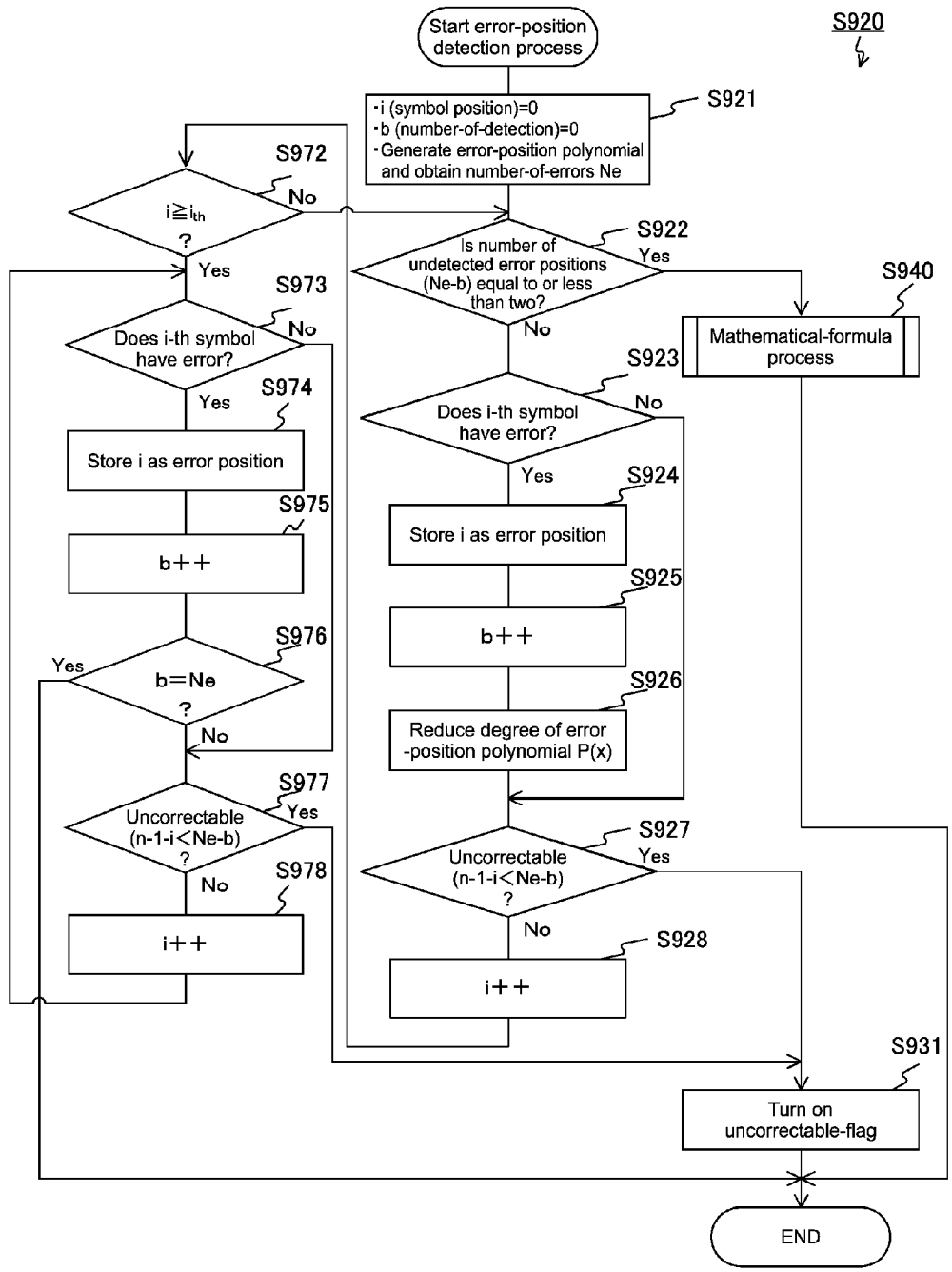
FIG. 16 is a flowchart showing an example of an error-position detection process of a third modification example.

FIG. 16 is a flowchart showing an example of the error-position detection process of the third modification example. The error-position detection process of the third modification example is different from the first embodiment in that it further includes Steps S972 to S978.

After the memory controller 300 increments the symbol position i (Step S928), the memory controller 300 determines if the symbol position i is equal to or more than the threshold $i_{th}$ or not (Step S972). Here, the error-position detection process finishes faster by continuously performing Chien search process on and after the symbol of the set threshold $i_{th}$ than by starting the mathematical-formula process. If the symbol position i is less than the threshold $i_{th}$ (Step S972: No), the memory controller 300 returns to Step S922. If the symbol position i is equal to or more than the threshold $i_{th}$ (Step S972: Yes), the memory controller 300 substitutes $A^{-i}$ into the error-position polynomial P(x), and determines if the i-th symbol has an error or not (Step S973). Here, the range less than the threshold $i_{th}$ is an example of the claimed predetermined range.

If the i-th symbol has an error (Step S973: Yes), the memory controller 300 stores the i, i.e., the error position, (Step S974) and increments the number-of-detection b (Step S975). Here, the degree of the error-position polynomial is not reduced. Then, the memory controller 300 determines if the number-of-detection b is Ne or not (Step S976). If the number-of-detection b is Ne (Step S976: Yes), the memory controller 300 finishes the error-position detection process. An effect similar to that of the second modification example is attained by executing Step S976.

If the i-th symbol has no error (Step S973: No) or if the number-of-detection b is not Ne (Step S976: No), the memory controller 300 determines if the mathematical formula 23 is satisfied or not, to thereby determine if an error is uncorrectable or not (Step S977).

If an error is correctable (Step S977: No), the memory controller 300 increments the symbol position i (Step S978), and returns to Step S973. Meanwhile, if an error is uncorrectable (Step S977: Yes), the memory controller 300 executes Step S931.

Note that the memory controller 300 may not execute Step S976 in another configuration. In this configuration, the memory controller 300 may determine if i is n or not after Step S978. Then, if i is n, the memory controller 300 finishes the error-position detection process. If not, the memory controller 300 returns to Step S973.

As described above, according to the modification example, if the symbol position i is equal to or more than the threshold $i_{th}$, the memory controller 300 does not reduce the degree of an error-position polynomial even if the memory controller 300 detects an error position. Because of this, it is possible to search for an error position faster after the threshold $i_{th}$.

Fourth Modification Example

In the first embodiment, the memory controller 300 does not determine if the undetected number-of-errors is one or not after reducing the degree. However, if the undetected number-of-errors is one, the error-position polynomial is a linear expression. It is possible to obtain error positions faster by using a mathematical formula. The memory controller 300 of the fourth modification example is different from that of the first embodiment in that it obtains error positions by using a mathematical formula if the undetected number-of-errors is one after reducing the degree.

Figure 17:
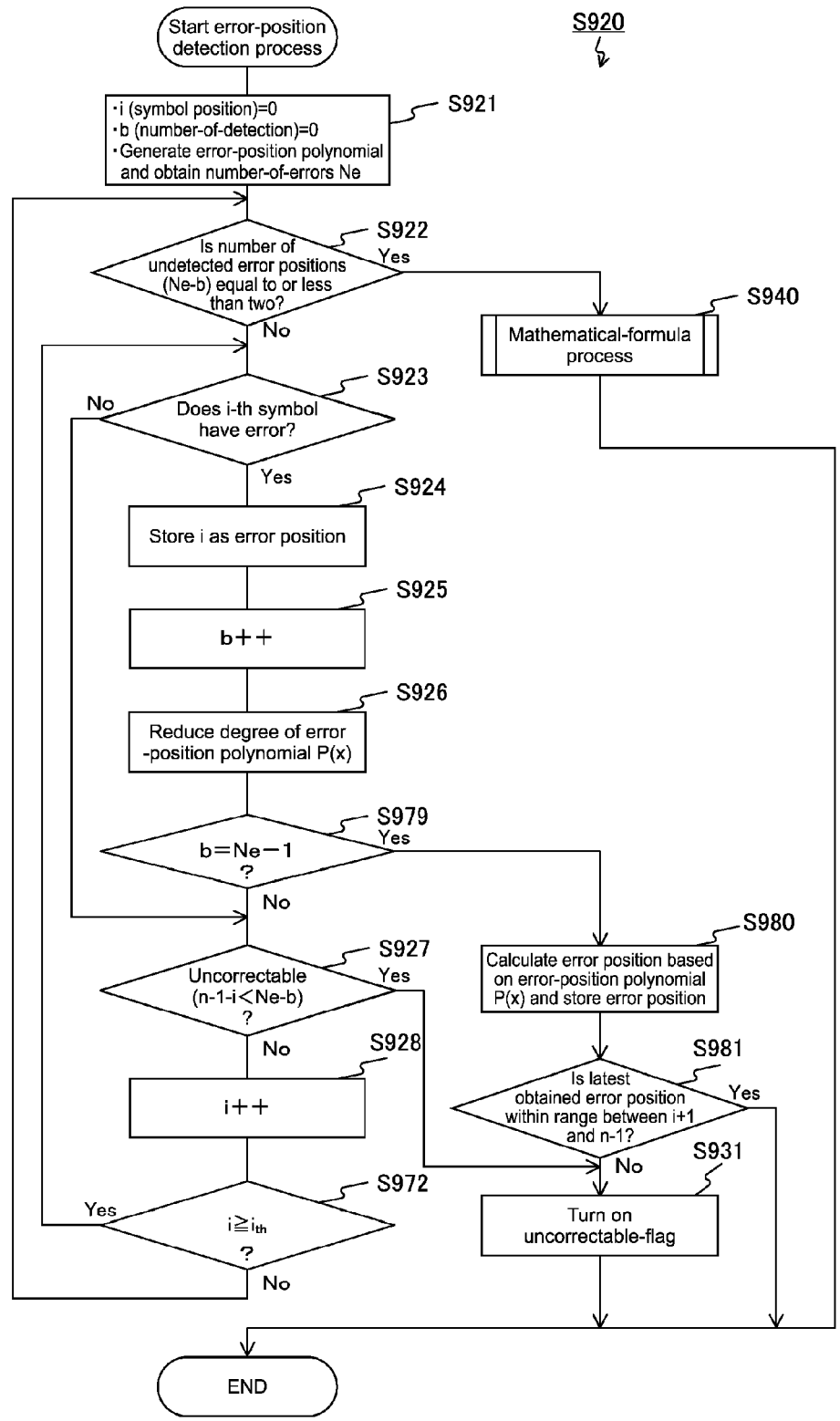
FIG. 17 is a flowchart showing an example of an error-position detection process according to a fourth modification example.

FIG. 17 is a flowchart showing an example of the error-position detection process according to the fourth modification example. The error-position detection process of the fourth modification example is different from that of the first embodiment in that it further includes Steps S972 and S979 to S981. After reducing the degree of the error-position polynomial P(x) (Step S926), the memory controller 300 determines if the number-of-detection b is Ne−1 or not (Step S979). If b is Ne−1, then it means that the number of residual error is one, and it is possible to detect the error position by using a mathematical formula at a high speed.

If the number-of-detection b is not Ne−1 (Step S979: No), the memory controller 300 executes Steps S927 and S928. Moreover, after Step S928, the memory controller 300 determines if the symbol position i is equal to or more than the threshold $i_{th}$ or not (Step S972). Here, the error-position detection process finishes faster by continuously performing Chien search process on and after the symbol of the set threshold $i_{th}$ than by starting the mathematical-formula process. If the symbol position i is equal to or more than the threshold $i_{th}$ (Step S972: Yes), the memory controller 300 returns to Step S923. Meanwhile, if the symbol position i is less than the threshold $i_{th}$ (Step S972: No), the memory controller 300 returns to Step S922. Moreover, if the number-of-detection b is Ne−1 (Step S979: Yes), the memory controller 300 calculates an error position based on the error-position polynomial P(x), whose degree is reduced, i.e., by using a mathematical formula. The memory controller 300 stores the error position (Step S980).

The memory controller 300 determines if the latest error position obtained in Step S980 is within the range between i+1 and n−1 or not (Step S981). If the latest error position is not within the range between i+1 and n−1 (Step S981: No), the memory controller 300 turns the uncorrectable-flag on (Step S931). Meanwhile, if the latest error position is within the range between i+1 and n−1 (Step S981: Yes), the memory controller 300 finishes the error-position detection process. For example, the single-error-position detector 364 executes the above-mentioned Steps S980, S981, and S931.

As described above, according to the fourth modification example, if the undetected number-of-errors is one after reducing the degree, its error position is obtained by using a mathematical formula. Because of this, it is possible to detect the error position at a high speed.

Fifth Modification Example

In the first embodiment, the memory controller 300 searches one position for an error position in one clock in Chien search. Alternatively, the memory controller 300 may search for a plurality of symbol positions in one clock. The memory controller 300 of the fifth modification example is different from that of the first embodiment in that it searches for a plurality of symbol positions in one clock.

Figure 18:
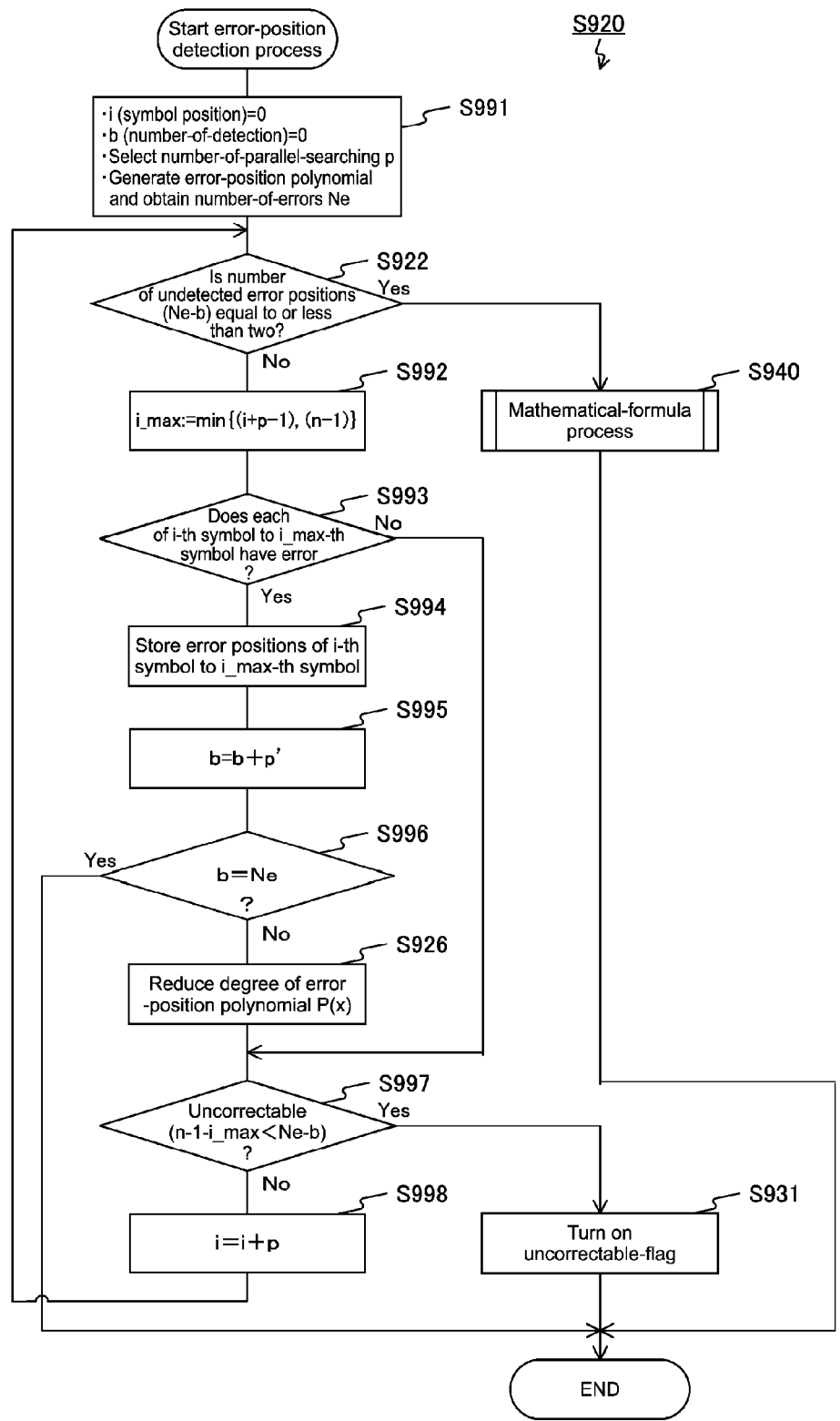
FIG. 18 is a flowchart showing an example of an error-position detection process of a fifth modification example.

FIG. 18 is a flowchart showing an example of the error-position detection process of the fifth modification example. The error-position detection process of the fifth modification example is different from that of the first embodiment in that it executes Steps S991 to S998 instead of Steps S921, S923 to S925, S927, and S928.

First, the memory controller 300 initializes the symbol position i and the number-of-detection b, generates an error-position polynomial P(x), and obtains the number-of-errors Ne. Further, the memory controller 300 selects the number-of-parallel-searching p (Step S991). Here, p is the number of symbol positions, which are searched for error positions in one clock. An integer equal to or more than two is set for p. The memory controller 300 determines if the number (Ne−b) of undetected-error-positions is equal to or less than two, or not (Step S922).

If (Ne−b) is equal to or more than three (Step S922: No), the memory controller 300 compares the p-th value (i+p−1) after i with i having the maximum value (n−1), and selects the smaller value as i_max (Step S992). The memory controller 300 determines if each of the i-th symbol to the i_max-th symbol has an error or not by using the error-position polynomial P(x) (Step S993).

If any of the i-th symbol to the i_max-th symbol has an error (Step S993: Yes), the memory controller 300 stores the positions, i.e., error positions (Step S994), and adds p' to the number-of-detection b (Step S995). Here, p' is the number of errors detected in Step S993. Then the memory controller 300 determines if the number-of-detection b is Ne or not (Step S996). If the number-of-detection b is Ne (Step S996: Yes), the memory controller 300 finishes the error-position detection process. When a plurality of symbol positions are searched in one clock, the loop of Step S922 to S997 is stopped by Step S996. Meanwhile, if the number-of-detection b is not Ne (Step S996: No), the memory controller 300 reduces the degree of the error-position polynomial P(x) based on error positions (Step S926).

If the i-th symbol to the i_max-th symbol have no error (Step S993: No) or after Step S926, the memory controller 300 determines if the mathematical formula 23, whose i is replaced by i_max, is satisfied or not, to thereby determine if an error is uncorrectable or not (Step S997).

If an error is correctable (Step S997: No), the memory controller 300 adds p to the symbol position i (Step S998), and returns to Step S922.

If an error is uncorrectable (Step S997: Yes), the memory controller 300 turns the uncorrectable-flag on (Step S931).

Moreover, the memory controller 300 may further execute the steps of the fourth modification example shown in FIG. 17 in the fifth modification example. In this case, the memory controller 300 may execute Step S979 to S981 after Step S926, and execute Step S972 after Step S998.

As described above, according to the fifth modification example, the memory controller 300 searches a plurality of symbol positions in one clock. As a result, it is possible to detect error positions at a higher speed.

Sixth Modification Example

The memory controller 300 may execute the steps of the second modification example shown in FIG. 15 in the fifth modification example shown in FIG. 18. The sixth modification example is obtained by applying the second modification example to the fifth modification example.

Figure 19:
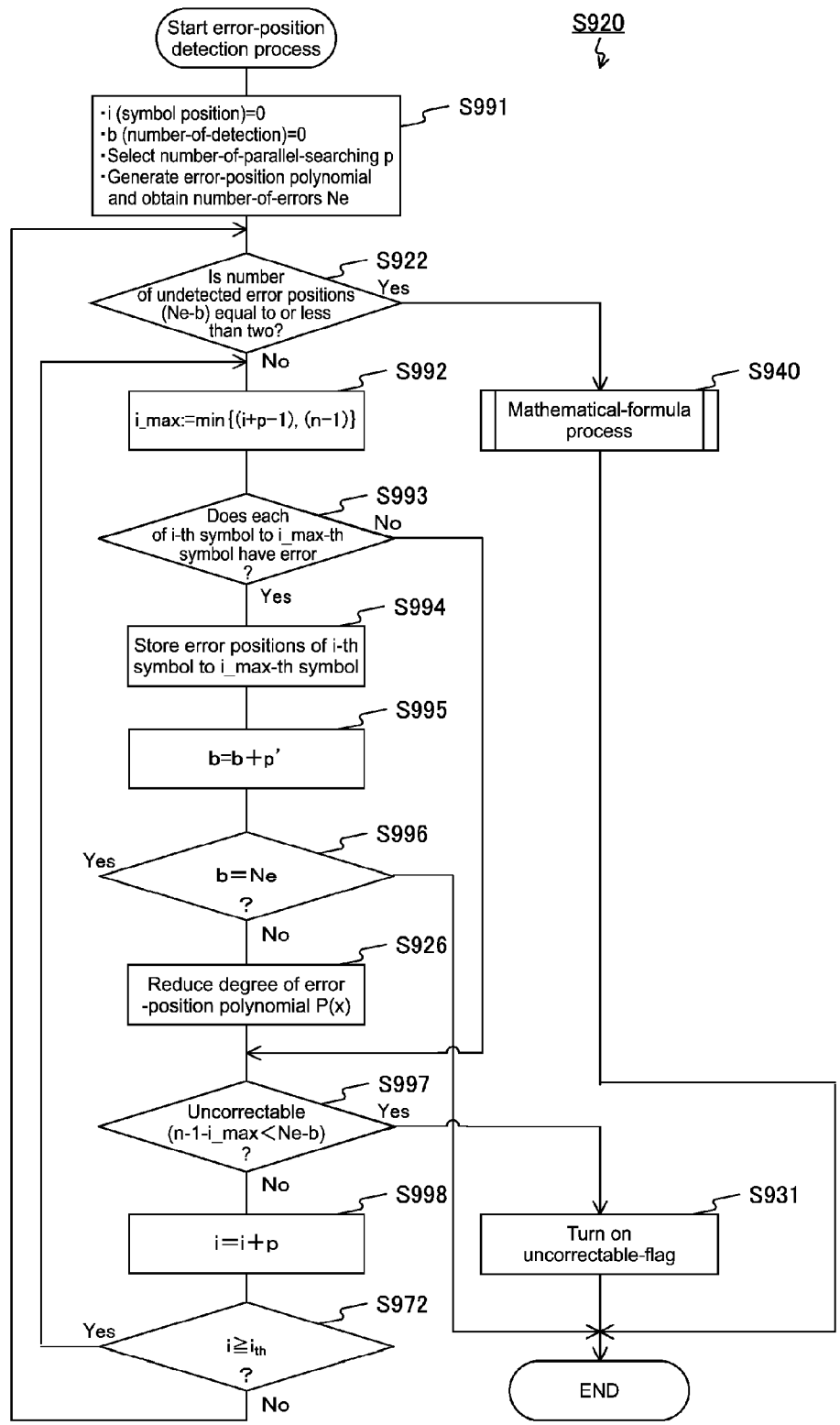
FIG. 19 is a flowchart showing an example of an error-position detection process of a sixth modification example.

FIG. 19 is a flowchart showing an example of the error-position detection process of the sixth modification example. In the sixth modification example, the memory controller 300 determines if the symbol position i is equal to or more than the threshold $i_{th}$ or not (Step S972) after Step S998. If the symbol position i is equal to or more than the threshold $i_{th}$ (Step S972: Yes), the memory controller 300 returns to Step S992. Meanwhile, if the symbol position i is less than the threshold $i_{th}$ (Step S972: No), the memory controller 300 returns to Step S922. Here, in the second modification example, if the condition of Step S927 is not Yes, the loop may not be stopped because there is Step S972. In view of this, the second modification example additionally includes Step S971. However, in the sixth modification example, if a plurality of errors are detected in Step S993 and then if b=Ne is satisfied in Step S996, the loop is stopped. In view of this, it is not necessary to additionally provide a new step corresponding to Step S971 in the sixth modification example.

Note that, in the sixth modification example, the memory controller 300 may not execute Step S996 in another configuration. In this configuration, if the symbol position i is equal to or more than the threshold $i_{th}$ (Step S972: Yes), the memory controller 300 may determine if i≥n is satisfied or not. Then, if i≥n is satisfied, the memory controller 300 stops the error-position detection process. If not, the memory controller 300 returns to Step S992. The condition is not i=n but i≥n because the number-of-parallel-searching p is added in Step S998.

Seventh Modification Example

Moreover, the memory controller 300 may further execute the steps of the third modification example shown in FIG. 16 in the fifth modification example shown in FIG. 18. The seventh modification example is attained by applying the third modification example to the fifth modification example.

Figure 20:
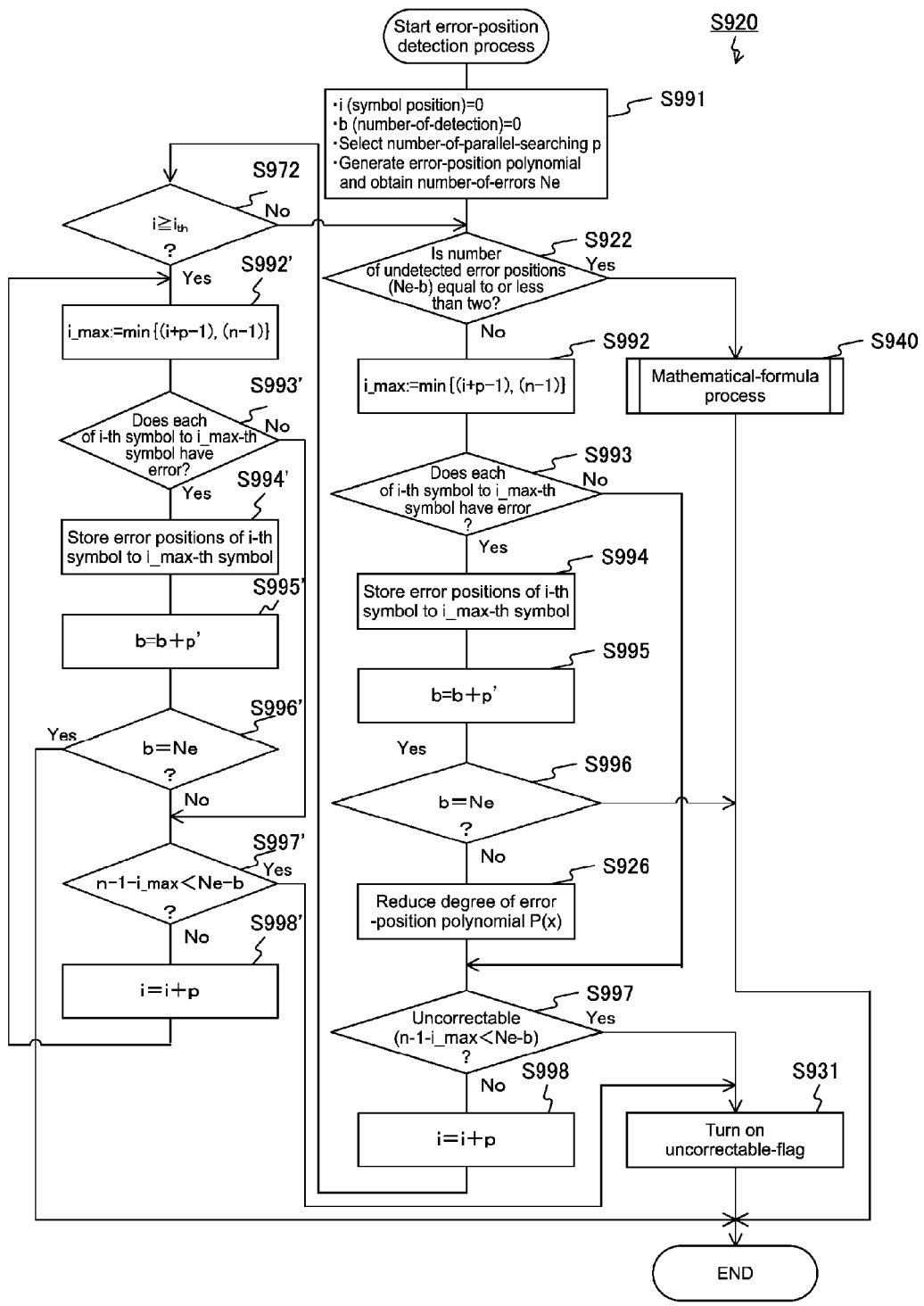
FIG. 20 is a flowchart showing an example of an error-position detection process of a seventh modification example.

FIG. 20 is a flowchart showing an example of the error-position detection process of the seventh modification example. In the seventh modification example, the memory controller 300 determines if the symbol position i is equal to or more than the threshold $i_{th}$ or not (Step S972) after Step S998. If the symbol position i is equal to or more than the threshold $i_{th}$ (Step S972: Yes), the memory controller 300 executes Steps S992' to S998', which are similar to Steps S992 to S998, and returns to Step S992' after Step S998'. Meanwhile, if the symbol position i is less than the threshold $i_{th}$ (Step S972: No), the memory controller 300 returns to Step S922.

Note that the memory controller 300 may not execute Step S996' in another configuration of the seventh modification example. In this configuration, the memory controller 300 may determine if the condition in is satisfied or not after Step S998'. Then, if the condition in is satisfied, the memory controller 300 finishes the error-position detection process. If not, the memory controller 300 returns to Step S992'.

2. Second Embodiment

In the first embodiment, the memory controller 300 updates the error-position polynomial P(x) every time the memory controller 300 detects an error position. Alternatively, the memory controller 300 may update the syndrome s every time the memory controller 300 detects an error position. This is because a polynomial similar to an updated error-position polynomial P(x) is obtained by updating the syndrome s. The memory controller 300 of the second embodiment is different from that of the first embodiment in that it updates the syndrome s every time it detects an error position.

Figure 21:
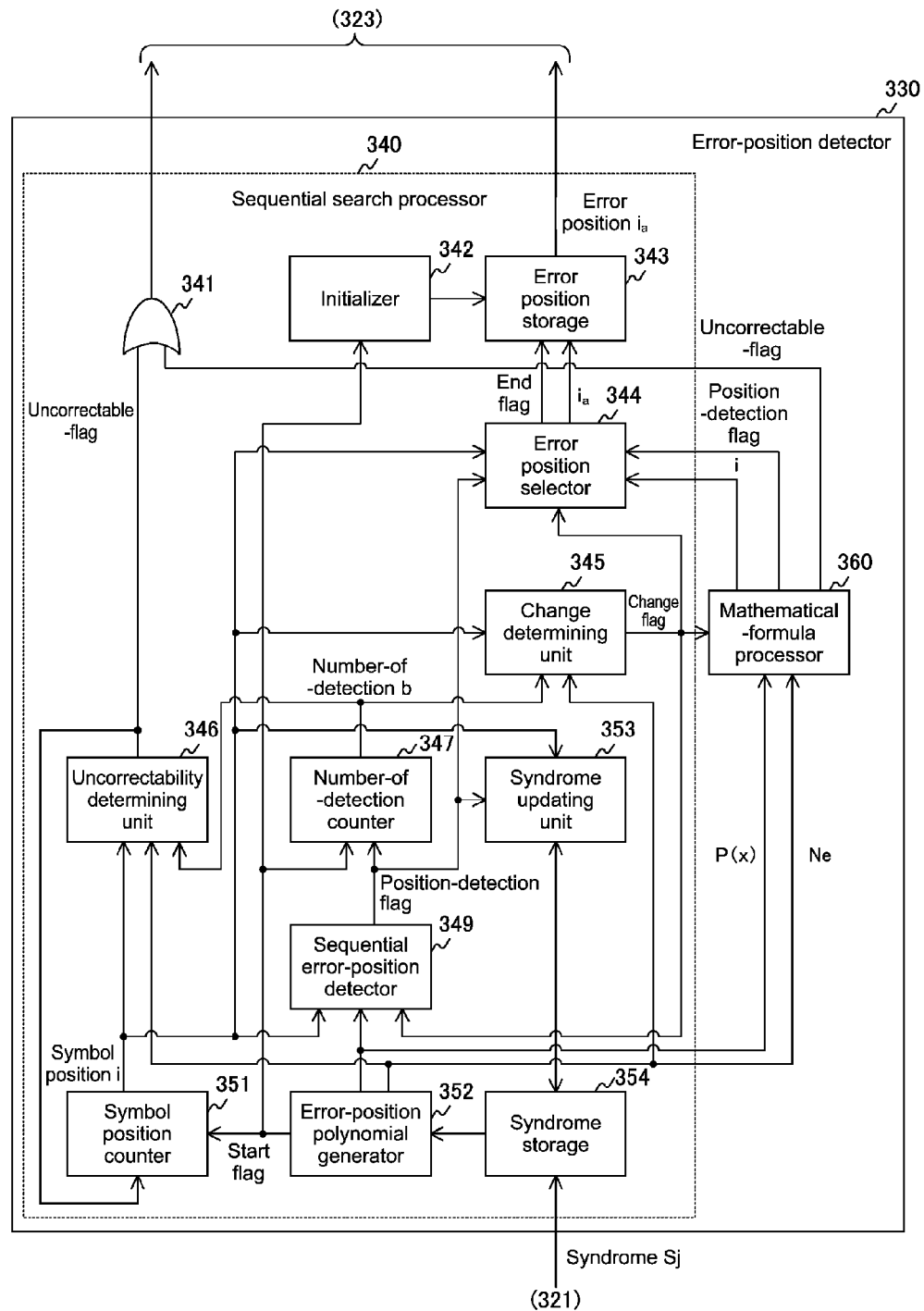
FIG. 21 is a block diagram showing an example of the configuration of an error-position detector of a second embodiment.

FIG. 21 is a block diagram showing an example of the configuration of the error-position detector 330 of the second embodiment. The error-position detector 330 of the second embodiment is different from that of the first embodiment in that it includes a syndrome updating unit 353 and syndrome storage 354 instead of the error-position polynomial updating unit 348 and the error-position polynomial storage 350.

The syndrome storage 354 is configured to store a syndrome s. The syndrome updating unit 353 updates the stored syndrome s every time an error position is detected in order to reduce the degree of an error-position polynomial.

The syndrome updating unit 353 reduces the component of the syndrome s every time an error position is detected. Here, the following mathematical formula shows a part check matrix $H_{Ne}$, which only includes the $i_a$ column out of the columns of the check matrix H shown in FIG. 5B.

Math. 24

$$H_{Ne} = [h_{i_1}^T, h_{i_2}^T \ldots h_{i_{Ne}}^T] \qquad 式 24$$

The following mathematical formula shows the column $i_a$ of the part check matrix $H_{Ne}$.

Math. 25

$$h_{i_a} := (A^{0 \cdot i_a}, A^{1 \cdot i_a}, \ldots, A^{(2t-1) \cdot i_a}) \qquad 式 25$$

Similarly, the following mathematical formula shows an error vector $e_{Ne}$, which only includes the components other than zero.

Math. 26

$$e_{Ne} := (e_{i_1}, e_{i_2}, \ldots, e_{i_{Ne}}) \qquad 式 26$$

The following mathematical formula shows the syndrome s exemplified by the mathematical formula 2 by using the part check matrix $H_{Ne}$ exemplified by the mathematical formula 24 and the error vector $e_{Ne}$ exemplified by the mathematical formula 26.

Math. 27

$$s^T = H \cdot e^T = H_{Ne} \cdot e_{Ne}^T = \sum_{a=1}^{Ne} e_{i_a} h_{i_a}^T \qquad 式 27$$

As exemplified by the above mathematical formula, a product sum of an error value and an $i_a$ column shows a syndrome s. Because of this, the syndrome updating unit 353 subtracts the product of an error value and an $i_a$ column from a syndrome s every time an error position i, is detected. As a result, it is possible to generate a syndrome, in which degree of an error-position polynomial decreases.

Specifically, when an error position i, is detected, the syndrome updating unit 353 obtains the $i_a$ column of the parity check matrix of the mathematical formula 27 from the mathematical formula 25 based on the error position. Moreover, the syndrome updating unit 353 obtains an error value $e_i$ based on the Forney algorithm. Then the syndrome updating unit 353 updates the syndrome of the syndrome storage 354 by using the following mathematical formula, where a syndrome to be updated is $S^u$.

Math. 28

$$s^l = s^u - e_{i_a} h_{i_a}^T \qquad 式 28$$

As exemplified by the above mathematical formula, a syndrome is updated based on subtraction. This process is easier than the process of updating an error-position polynomial, which requires division. Because of this, the error-position detector 330 has a configuration simpler than that of the first embodiment.

The error-position polynomial generator 352 of the second embodiment obtains a syndrome s from the syndrome storage 354, generates an error-position polynomial P(x), and supplies the coefficients of the polynomial to the sequential error-position detector 349 and the mathematical-formula processor 360.

The following mathematical formula shows a syndrome, where the number-of-undetection $Ne^h$ is "1", based on the notation of the mathematical formula 27.

Math. 29

$$s^u = e_{i_1} h_{i_1} \qquad 式 29$$

As exemplified by the above mathematical formula, the degree of the error-position polynomial is "1". Because of this, the mathematical-formula processor 360 of the second embodiment is capable of obtaining error positions by using a mathematical formula similar to the first embodiment. Meanwhile, the following mathematical formula shows a syndrome where the number-of-undetection $Ne^h$ is "2".

Math. 30

$$s^u = \sum_{a=1}^{2} e_{i_a} h_{i_a} = e_{i_1} h_{i_1} + e_{i_2} h_{i_2} \qquad 式 30$$

Here, the above mathematical formula is deformed whereby the following mathematical formula is obtained.

Math. 31

$$s^u_j = e_{i_1} A^{j \cdot i_1} + e_{i_2} A^{j \cdot i_2} \qquad 式 31$$

The mathematical-formula processor 360 uses $s^u_j$ where j is 0 to 3 in the Peterson algorithm. As a result, the mathematical-formula processor 360 obtains coefficients of the error-position polynomial $P^h(x)$. Specifically the mathematical-formula processor 360 obtains the coefficients based on the following formulae.

$$P^h_2 = \{(s^u_2)^2 - s^u_1 s^u_3\} / \{(s^u_1)^2 - s^u_0 s^u_2\} \qquad \text{Math. 32}$$

$$P^h_1 = (s^u_0 s^u_3 - s^u_1 s^u_3) / \{(s^u_1)^2 - s^u_0 s^u_2\} \qquad \text{Math. 33}$$

$$P^h_0 = 1 \qquad \text{Math. 34}$$

Figure 22:
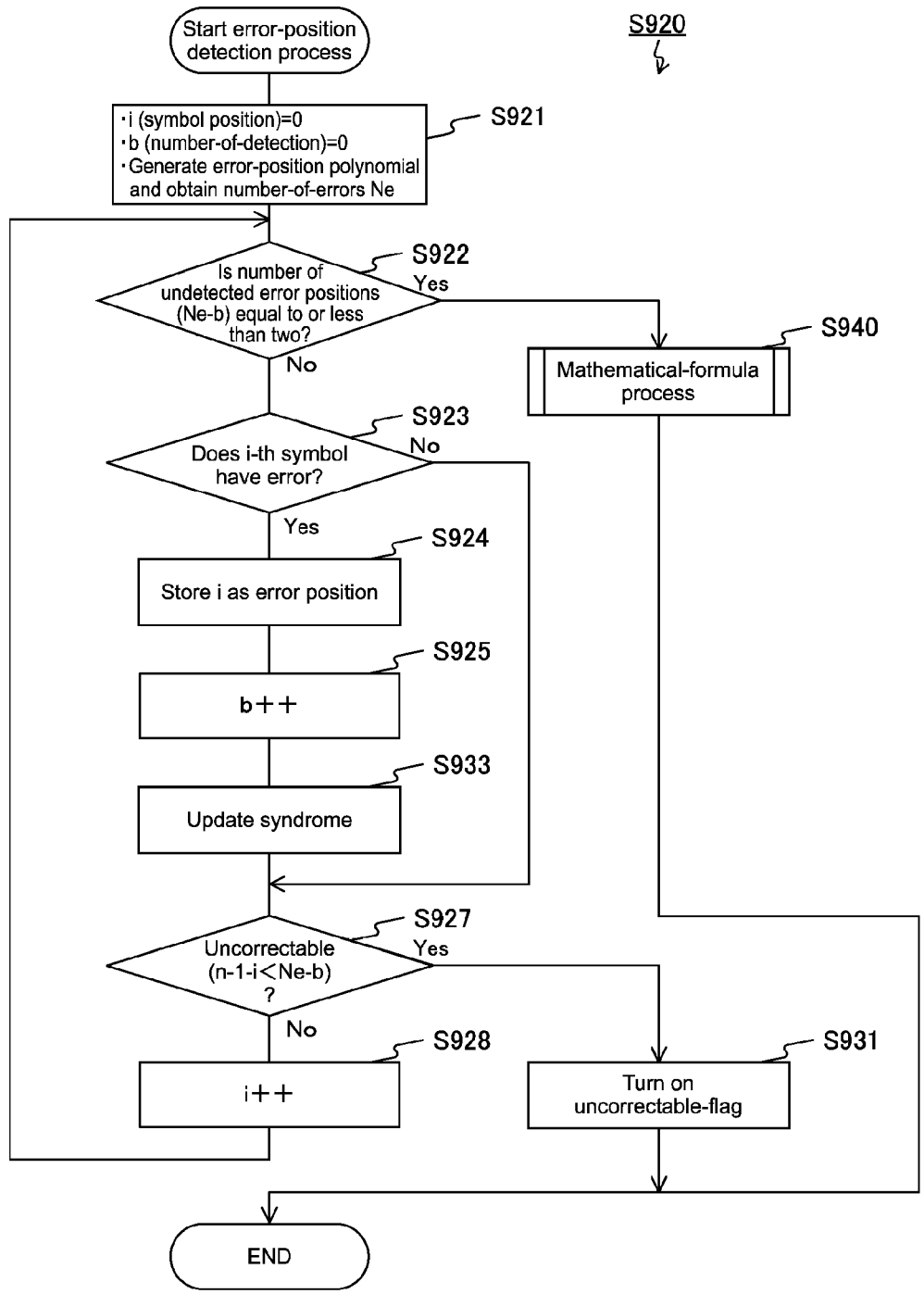
FIG. 22 is a flowchart showing an example of an error-position detection process of the second embodiment.

FIG. 22 is a flowchart showing an example of the error-position detection process of the second embodiment. The error-position detection process of the second embodiment is different from that of the first embodiment in that it includes Step S933 instead of Step S926.

The memory controller 300 increments the number-of-detection b (Step S925). Then the memory controller 300 updates the syndrome s by using the mathematical formula 27 (Step S933). Then the memory controller 300 determines if errors are correctable or not (Step S927).

Note that each of the second to seventh modification examples may be applied to the error-position detection process shown in FIG. 22. Specifically, the flowchart shown in each of FIG. 15 to FIG. 20 may include Step S933 instead of Step S926.

As described above, according to the second embodiment, the syndrome is updated every time an error position is detected. Because of this, it is possible to detect error positions by using a simple configuration.

3. Third Embodiment

In the first embodiment, the memory controller 300 updates the error-position polynomial P(x) every time the memory controller 300 detects an error position. Alternatively, every time the memory controller 300 detects an error position, the memory controller 300 may update a polynomial Q'(x), which has the detected error position in the root. The memory controller 300 may divide the original error-position polynomial P(x) by Q'(x) only once immediately before the memory controller 300 starts the mathematical-formula process. This is because a polynomial, which is similar to the error-position polynomial P(x) input in the mathematical-formula processor 360 in the first embodiment, is obtained by the division. The memory controller 300 of the third embodiment is different from that of the first embodiment in that every time it detects an error position, it updates a polynomial Q'(x), which has the detected error position in the root. The memory controller 300 of the third embodiment is further different from that of the first embodiment in that it divides the original error-position polynomial P(x) by Q'(x) only once immediately before the memory controller 300 starts the mathematical-formula process.

Figure 23:
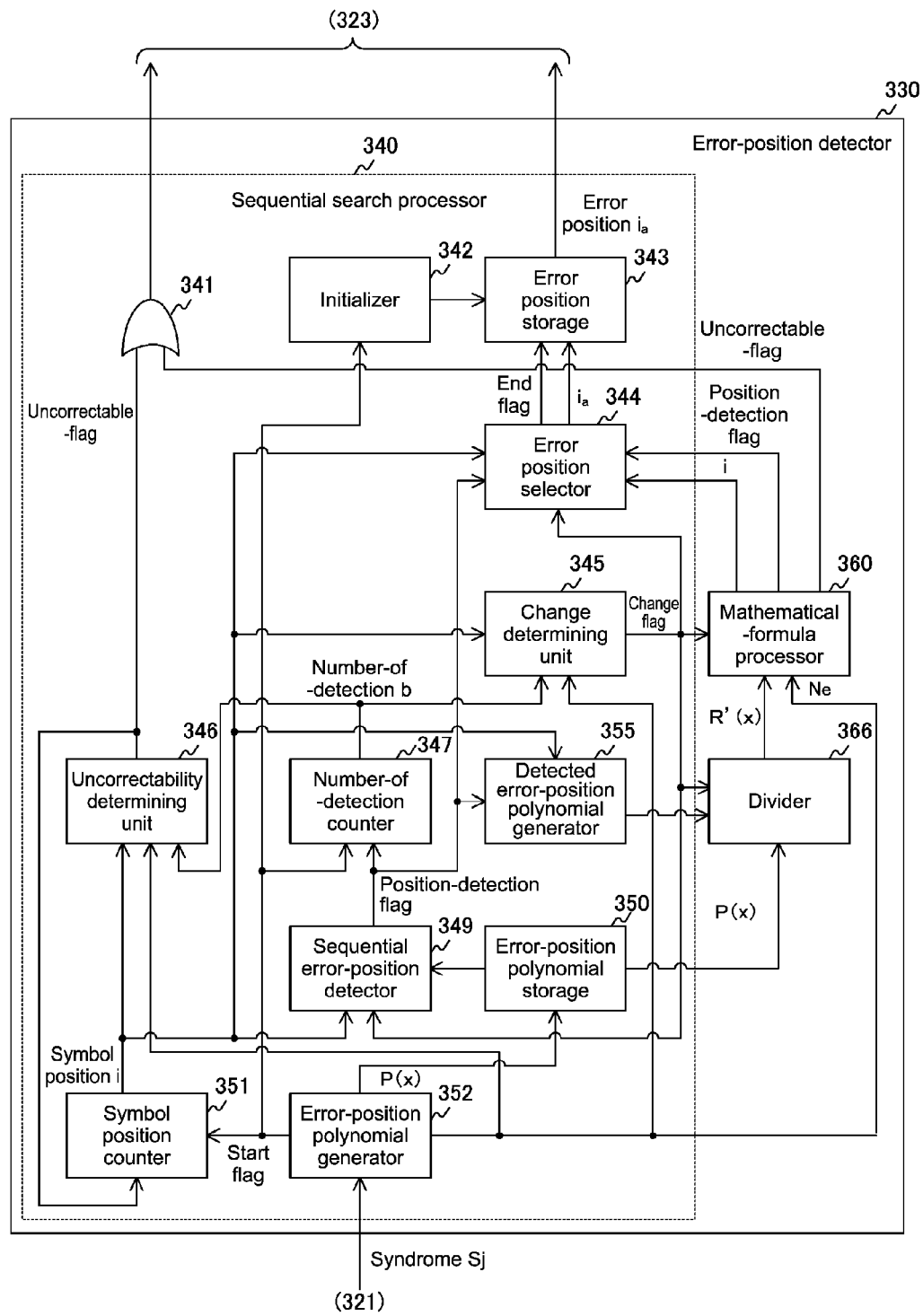
FIG. 23 is a block diagram showing an example of the configuration of an error-position detector of a third embodiment.

FIG. 23 is a block diagram showing an example of the configuration of the error-position detector 330 of the third embodiment. The error-position detector 330 of the third embodiment is different from that of the first embodiment in that it includes a detected error-position polynomial generator 355 and a divider 366 instead of the error-position polynomial updating unit 348.

Every time an error position is detected, the detected error-position polynomial generator 355 generates a detected error-position polynomial Q'(x) as follows. The detected error-position polynomial generator 355 initializes Q'(x) with an initial value (for example, "1") at a time when the error-position polynomial P(x) is generated. Every time an error position i is detected, the detected error-position polynomial generator 355 updates Q'(x) by using the following mathematical formula. Note that the detected error-position polynomial generator 355 is an example of the claimed multiplier.

$$Q'(x)=Q'(x)\cdot(x-\alpha^i)$$ Math. 35

If the change determining unit 345 supplies a change flag "1", the divider 366 divides out the detected error-position polynomial Q'(x), which is generated by the detected error-position polynomial generator 355, by the original error-position polynomial P(x), to thereby generate an error-position polynomial R'(x). Specifically, the divider 366 divides P(x) by the following mathematical formula, to thereby obtain the quotient, i.e., R'(x).

$$R'(x)=P(x)/Q'(x)$$ Math. 36

The degree of the polynomial R'(x) obtained based on this formula is equal to or less than the degree of P(x), and the polynomial R'(x) has all the undetected-error-positions in the root.

The divider 366 supplies the coefficients of R'(x) to the mathematical-formula processor 360 instead of coefficients of an error-position polynomial P(x).

As described above, multiplication is only required for update of the detected error-position polynomial Q'(x). If the number-of-undetection $Ne^h$ is equal to or less than a predetermined number (for example, "2"), the memory controller 300 only have to calculate the mathematical formula 36 (division), to thereby generate R'(x). Because of this, the number of division is less than that of the first embodiment, and the time of decoding process is reduced.

Figure 24:
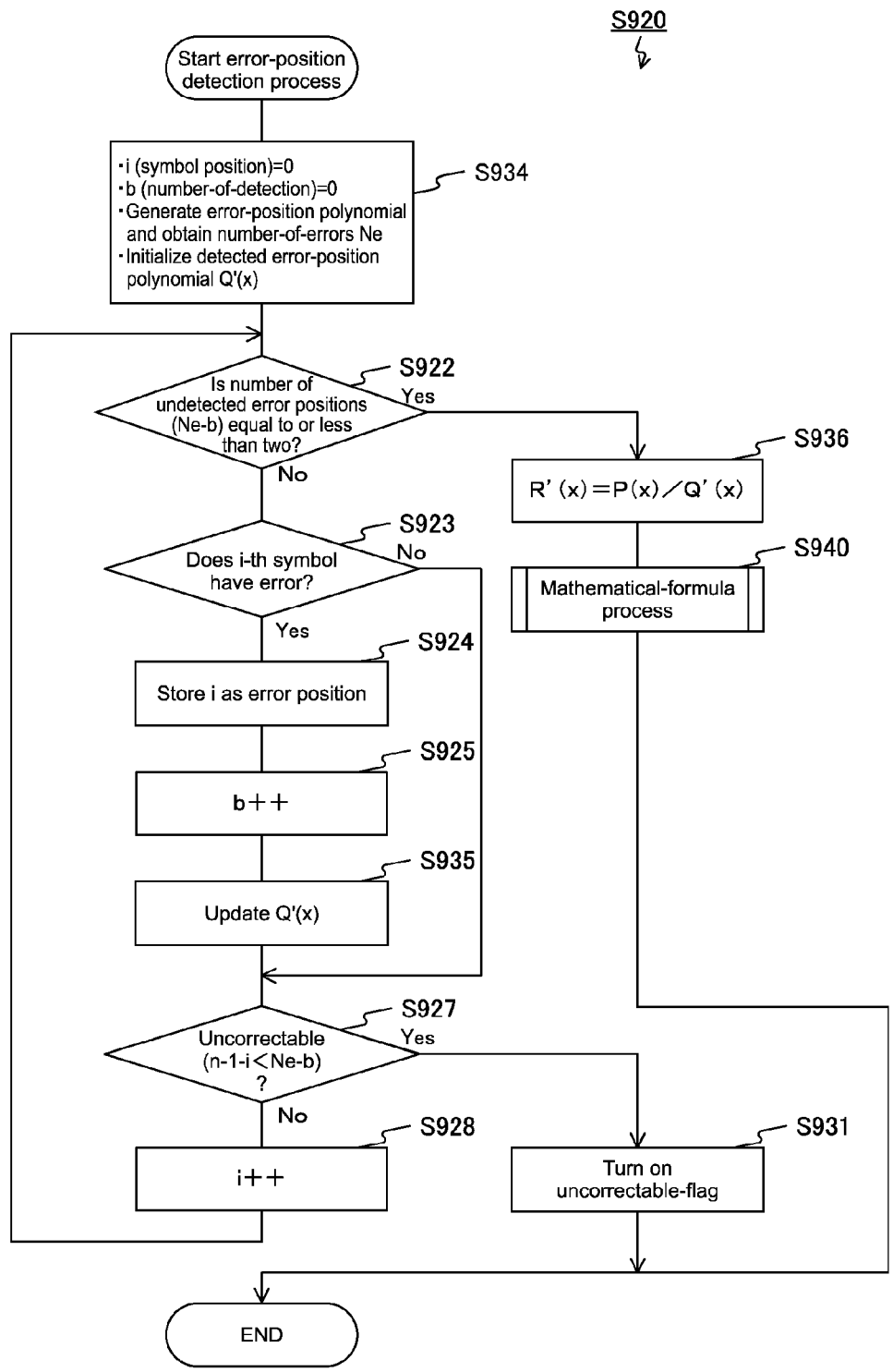
FIG. 24 is a flowchart showing an example of an error-position detection process of the third embodiment.

FIG. 24 is a flowchart showing an example of the error-position detection process of the third embodiment. The error-position detection process of the third embodiment is different from the first embodiment in that it includes Step S934 to Step S936 instead of Steps S921 and S926.

In initialization, the memory controller 300 not only initializes the symbol position i and the like, but also initializes the detected error-position polynomial Q'(x) (Step S934). Moreover, after the memory controller 300 increments the number-of-detection b (Step S925), the memory controller 300 updates the detected error-position polynomial Q'(x) by using the mathematical formula 35 (Step S935). Then the memory controller 300 determines if errors are correctable or not (Step S927). If the number-of-undetection $Ne^h$ is equal to or less than two (Step S922: Yes), the memory controller 300 obtains R'(x) by using the mathematical formula 36 (Step S936). Then the memory controller 300 executes the mathematical-formula process (Step S940).

Note that, the second, third, or fifth modification example may be further applied to the error-position detection process shown in FIG. 24. Specifically, the flowchart shown in FIG. 15, FIG. 16, or FIG. 18 may include Steps S934 and S935 instead of Steps S921 and S926. Moreover, if the number of undetected-error-positions is equal to or less than two (Step S922: Yes), Step S936 and then Step S940 may be executed.

Moreover, the fourth modification example may be applied to the error-position detection process shown in FIG. 24. Specifically, the flowchart shown in FIG. 17 may include Steps S934 and S935 instead of Steps S921 and S926. Moreover, if the number of undetected-error-positions is equal to or less than two (Step S922: Yes), Step S936 and then Step S940 are executed. Moreover, if b=Ne−1 is established (Step S979: Yes) Step S936 and then Step S980 may be executed.

Moreover, the detected error-position polynomial may be updated immediately before the memory controller 300 starts the mathematical-formula process. Specifically, if the number of undetected-error-positions is equal to or less than two (Step S922: Yes), Steps S935 and S936, and then Step S940 may be executed.

Moreover, if the degree of Q'(x) is equal to or more than a predetermined number, division may be performed. Specifically, after Step S935, the memory controller 300 confirms the degree of Q'(x), and determines if the degree of Q'(x) is equal to or more than a predetermined number or not. If the degree of Q'(x) is equal to or more than a predetermined number, Step S936 is executed. After that, the step "P(x)=R'(x)" and Step S927 are executed. Meanwhile, if the degree of Q'(x) is less than a predetermined number, the memory controller 300 executes Step S927.

As described above, according to the third embodiment, it is necessary to perform division, i.e., division by the detected error-position polynomial, only once. As a result, the time of decoding process is reduced.

4. Fourth Embodiment

In the first embodiment, the memory controller 300 starts the mathematical-formula process if the number $Ne^h$ of an undetected-error-position is equal to or less than two during Chien search. However, the memory controller 300 may execute the mathematical-formula process before executing Chien search and also during Chien search. The memory controller 300 of the fourth embodiment is different from that of the first embodiment in that it executes the mathematical-formula process before executing Chien search and during Chien search.

Figure 25:
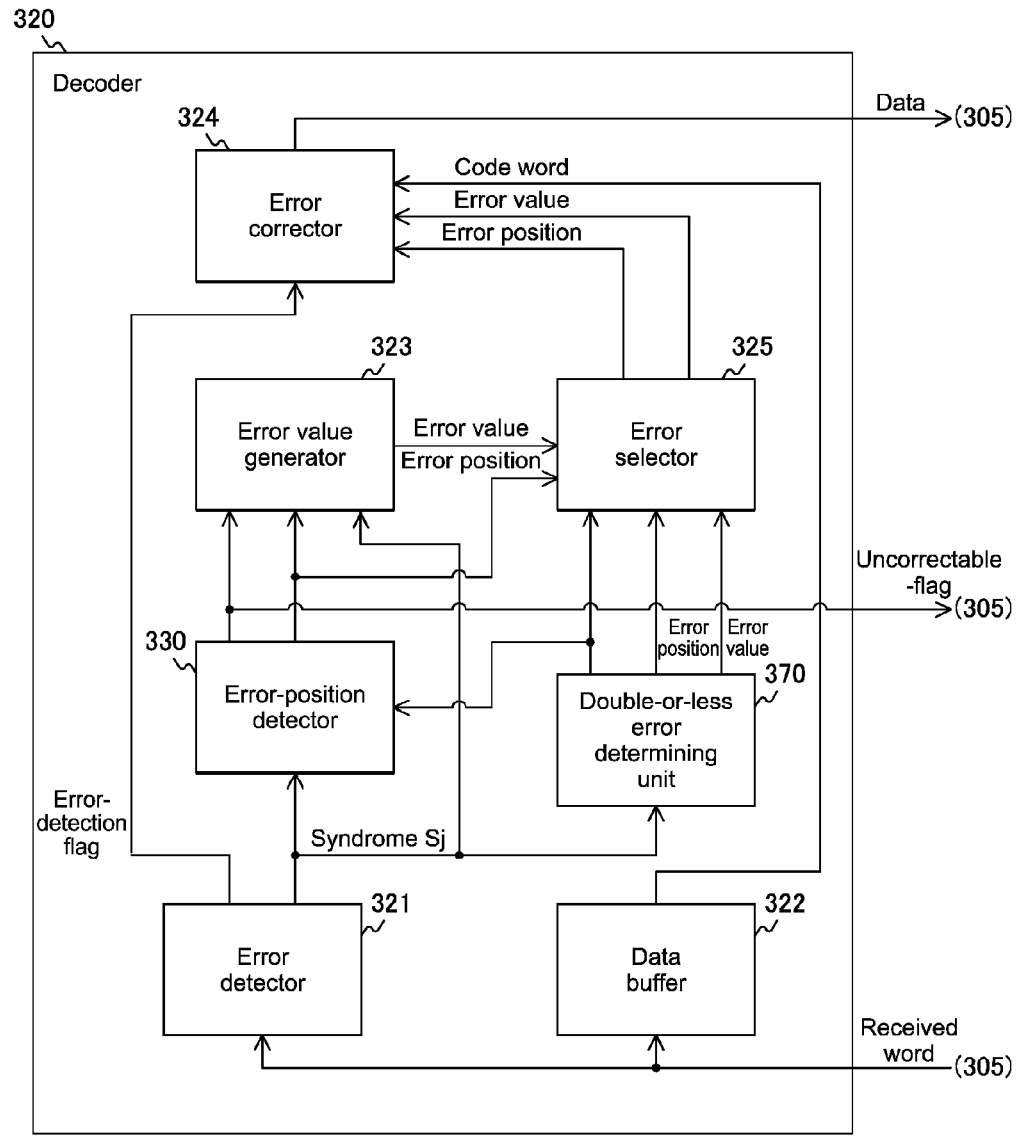
FIG. 25 is a block diagram showing an example of the configuration of a decoder of a fourth embodiment.

FIG. 25 is a block diagram showing an example of the configuration of the decoder 320 of the fourth embodiment. The decoder 320 of the fourth embodiment is different from that of the first embodiment in that it further includes an error selector 325 and a double-or-less error determining unit 370.

The double-or-less error determining unit 370 is configured to determine if one of a double error and a single error have/has occurred or not. The double-or-less error determining unit 370 executes the mathematical-formula process assuming that a double error or a single error have/has occurred (in other words, the number-of-errors Ne is equal to or less than two). Here, if the actual number of errors of a received word is equal to or more than three, it conflicts with the assumption. As a result, the double-or-less error determining unit 370 fails to detect error positions in the mathematical-formula process. In other words, the double-or-less error determining unit 370 is capable of determining if the number-of-errors Ne is equal to or less than two or not based on the success/failure of the error position detection.

The double-or-less error determining unit 370 generates a double-or-less error judgment flag based on the success/failure of the error position detection, and supplies the double-or-less error judgment flag to the error selector 325 and the error-position detector 330. The double-or-less error judgment flag shows if the number-of-errors Ne is equal to or less than two or not. For example, if the number-of-errors Ne is equal to or less than two, "1" is set for the double-or-less error judgment flag. If not, "0" is set for the double-or-less error judgment flag.

Moreover, if the number-of-errors Ne is equal to or less than two, the double-or-less error determining unit 370 generates an error value, and supplies the error position and the error value to the error selector 325. Note that the double-or-less error determining unit 370 is an example of the claimed number-of-errors determining unit.

The error selector 325 is configured to select an error position and an error value based on a double-or-less error judgment flag. If the double-or-less error judgment flag has the value "1" (i.e., the number-of-errors Ne is equal to or less than two), the error selector 325 selects an error position and an error value from the double-or-less error determining unit 370. Meanwhile, if the double-or-less error judgment flag has the value "0", the error selector 325 selects an error position from the error-position detector 330 and an error value from the error value generator 323. The error selector 325 supplies the selected error position and error value to the error corrector 324.

The configuration of the error-position detector 330 of the fourth embodiment is similar to that of the first embodiment. Note that the error-position detector 330 of the fourth embodiment is configured to detect an error position if the double judgment flag has the value "0". Then the error-position detector 330 supplies the detected error position to the error value generator 323 and the error selector 325. The error value generator 323 of the fourth embodiment is similar to that of the first embodiment except for it supplies the generated error value to the error selector 325.

Note that the double-or-less error determining unit 370 and the error-position detector 330 of the decoder 320 detect errors in order in this configuration. Alternatively, in another configuration, the double-or-less error determining unit 370 and the error-position detector 330 may detect errors in parallel. In this case, the error-position detector 330 may output a detected error position if the double judgment flag has the value

Example of Configuration of Double-or-Less Error Determining Unit

Figure 26:
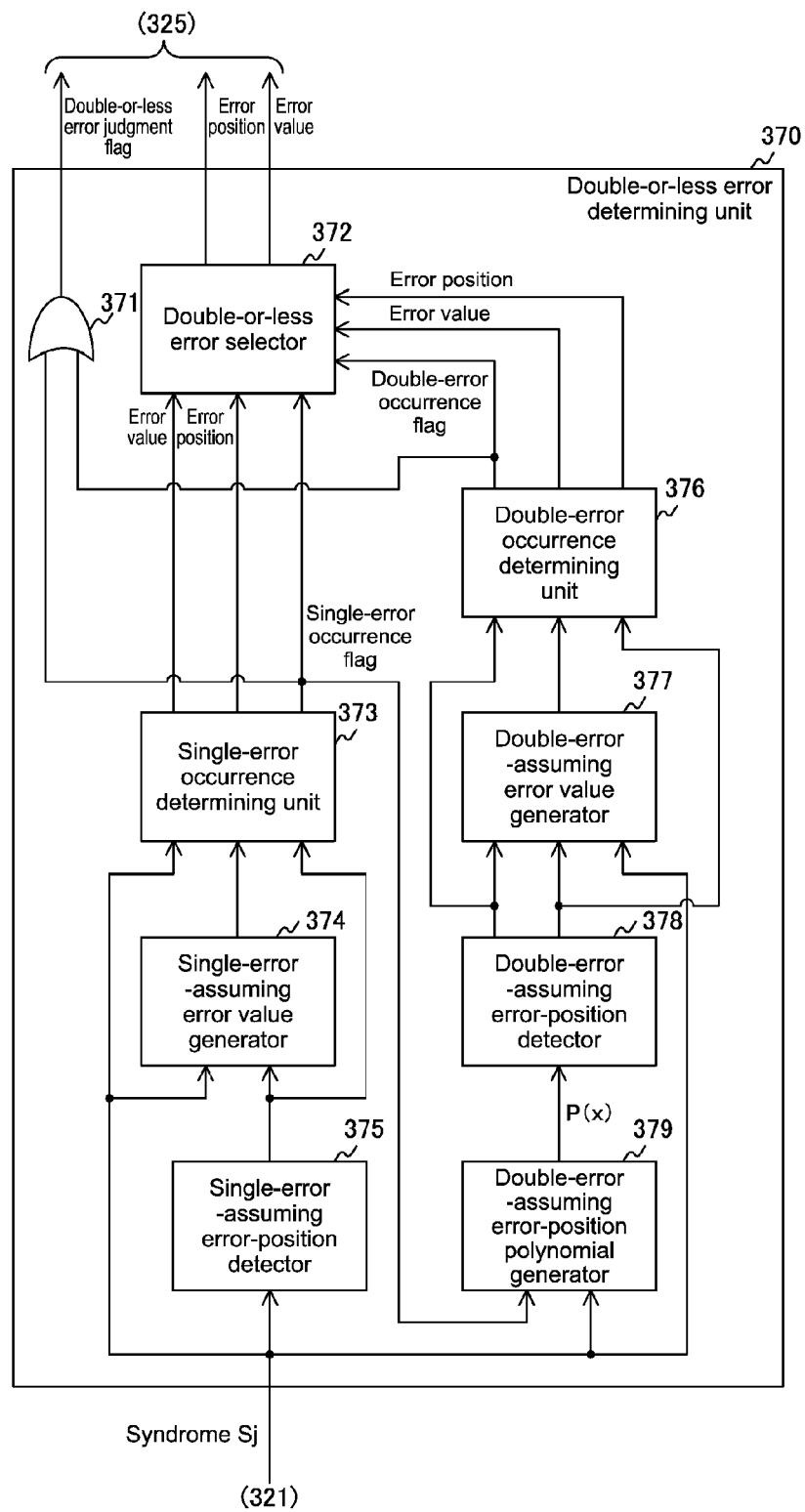
FIG. 26 is a block diagram showing an example of the configuration of the double-or-less error determining unit of the fourth embodiment.

FIG. 26 is a block diagram showing an example of the configuration of the double-or-less error determining unit 370 of the fourth embodiment. The double-or-less error determining unit 370 includes an OR gate 371, a double-or-less error selector 372, a single-error occurrence determining unit 373, a single-error-assuming error value generator 374, and a single-error-assuming error-position detector 375. The double-or-less error determining unit 370 further includes a double-error occurrence determining unit 376, a double-error-assuming error value generator 377, a double-error-assuming error-position detector 378, and a double-error-assuming error-position polynomial generator 379.

The single-error-assuming error-position detector 375 is configured to detect an error position assuming that a single error occurs. "1" is set for the number-of-errors Ne of the mathematical formula 2, whereby the following mathematical formula is obtained. The following mathematical formula shows a component $s_j$ of the syndrome when a single error occurs.

Math. 37

$$s_j = e_{i_1} A^{(j i_1)} \qquad \text{式 37}$$

The following mathematical formula includes the component $s_j$ of the above mathematical formula where j (j is an integer between 0 and 2t−1) is $j_1$, and the component $s_j$ where j is $j_1+1$. The error position of a single error is obtained based on the following mathematical formula.

Math. 38

$$A^{i_1} = s_{j_1+1}/s_{j_1} \qquad \text{式 38}$$

In the above mathematical formula, the power index $i_1$ of the left side shows the error position.

The single-error-assuming error-position detector 375 detects an error position by using the mathematical formula 38, and supplies the error position to the double-or-less error selector 372, the single-error-assuming error value generator 374, and the single-error occurrence determining unit 373.

The single-error-assuming error value generator 374 is configured to generate an error value assuming that a single error has occurred. The single-error-assuming error value generator 374 generates an error value by using the mathematical formula 37 by using the following mathematical formula.

Math. 39

$$e_{i_1} = s_{j_1}/(A^{i1})^{j1} \qquad \text{式 39}$$

In the above mathematical formula, the left side shows an error value.

The single-error-assuming error value generator 374 supplies the generated error value to the single-error occurrence determining unit 373.

The single-error occurrence determining unit 373 is configured to determine if a single error has occurred or not. The single-error occurrence determining unit 373 determines if the following mathematical formula is satisfied or not, where j is each of 0 to 2t−1, based on the error position and the error value, which are obtained assuming that a single error has occurred, and based on the syndrome.

Math. 40

$$S_j = e_{i_1}(A^{i1})^j \qquad \text{式 40}$$

If only one error has occurred actually, the above mathematical formula is satisfied where j is each of 0 to 2t−1. In other words, if the above mathematical formula is satisfied where j is each of 0 to 2t−1, the single-error occurrence determining unit 373 determines that a single error position has occurred. If not, the single-error occurrence determining unit 373 determines that two or more errors have occurred. The single-error occurrence determining unit 373 generates a single-error occurrence flag, which shows the determined result. The single-error occurrence determining unit 373 supplies the single-error occurrence flag to the OR gate 371, the double-or-less error selector 372, and the double-error-assuming error-position polynomial generator 379. For example, the value "1" is set for the single-error occurrence flag if a single error has occurred. If not, "0" is set for the single-error occurrence flag.

Moreover, if a single error has occurred, the single-error occurrence determining unit 373 supplies an error position from the single-error-assuming error-position detector 375 and an error value from the single-error-assuming error value generator 374 to the double-or-less error selector 372.

The double-error-assuming error-position polynomial generator 379 generates an error-position polynomial P(x) assuming that a double error has occurred. If the single-error occurrence flag has the value "0", the double-error-assuming error-position polynomial generator 379 generates an error-position polynomial P(x) where the degree is "2" by using the mathematical formula 11 or the like. Then the double-error-assuming error-position polynomial generator 379 supplies the coefficients of the terms of the generated error-position polynomial P(x) to the double-error-assuming error-position detector 378.

The double-error-assuming error-position detector 378 is configured to detect error positions assuming that a double error has occurred. If the double-error-assuming error-position polynomial generator 379 generates an error-position polynomial P(x), the double-error-assuming error-position detector 378 detects two error positions by using a mathematical formula (one of the mathematical formula 17 to the mathematical formula 21). Moreover, the double-error-assuming error-position detector 378 generates an uncorrectable-flag based on the fact that the trace Tr(B) is zero or not.

The double-error-assuming error-position detector 378 supplies an uncorrectable-flag and the detected error position to the double-error occurrence determining unit 376 and the double-error-assuming error value generator 377.

The double-error-assuming error value generator 377 is configured to generate error values assuming that a double error has occurred. If the double-error-assuming error-position detector 378 supplies error positions, the double-error-assuming error value generator 377 uses the mathematical formulae 2 where j=0 and 1, solves the simultaneous equations and the like, and generates error values. The double-error-assuming error value generator 377 supplies the generated error values to the double-error occurrence determining unit 376.

The double-error occurrence determining unit 376 is configured to determine if a double error has occurred or not. If the uncorrectable-flag has the value "1", the double-error occurrence determining unit 376 determines that three or more errors have occurred.

Meanwhile, if the uncorrectable-flag has the value "0", the double-error occurrence determining unit 376 obtains a presumed syndrome $s^p$ by using the following mathematical formula based on the obtained error position and error value assuming that a double error has occurred.

Math. 41

$$s^p = e_{i_1}h_{i_1} + e_{i_2}h_{i_2} \qquad \text{式 41}$$

The double-error occurrence determining unit 376 determines if the presumed syndrome $s^p$ is the same as the syndrome s from the error detector 321 or not. If two errors have occurred actually, the syndromes are the same. Because of this, if the syndromes are the same, the double-error occurrence determining unit 376 determines that a double error has occurred. If not, the double-error occurrence determining unit 376 determines that a double error has not occurred.

The double-error occurrence determining unit 376 generates a double-error occurrence flag based on a determined result that a double error has occurred or not. The double-error occurrence determining unit 376 supplies the double-error occurrence flag to the OR gate 371 and the double-or-less error selector 372. For example, if a double error has occurred, the value "1" is set for the double-error occurrence flag. If not, the value "0" is set for the double-error occurrence flag.

The double-or-less error selector 372 is configured to select one of an error position and an error value obtained assuming that a single error has occurred, and error positions and error values obtained assuming that a double error has occurred. If the single-error occurrence flag has the value "1", the double-or-less error selector 372 selects the error position and the error value from the single-error occurrence determining unit 373.

Moreover, if the double-error occurrence flag has the value "1", the double-or-less error selector 372 selects the error position and the error value from the double-error occurrence determining unit 376. The double-or-less error selector 372 supplies the selected error position(s) and the selected error value(s) to the error corrector 324.

The OR gate 371 is configured to generate a logical disjunction of input values. The single-error occurrence flag and the double-error occurrence flag are input in the OR gate 371. The OR gate 371 generates a logical disjunction of the value of those flags, i.e., a double-or-less error judgment flag. The OR gate 371 supplies the generated double-or-less error judgment flag to the error-position detector 330 and the error selector 325.

Note that the double-or-less error determining unit 370 determines if a single error has occurred or not, and then determines if a double error has occurred or not in this configuration. Alternatively, the double-or-less error determining unit 370 may determine if a single error has occurred or not and if a double error has occurred or not in parallel.

Moreover, the single-error-assuming error-position detector 375 may share a circuit or a program with the single-error-position detector 364 of the mathematical-formula processor 360 shown in FIG. 8. Similarly, the double-error-assuming error-position detector 378 may share circuits or programs with the trace calculator 363 and the double-error-position detector 362 of the mathematical-formula processor 360 shown in FIG. 8.

Figure 27:
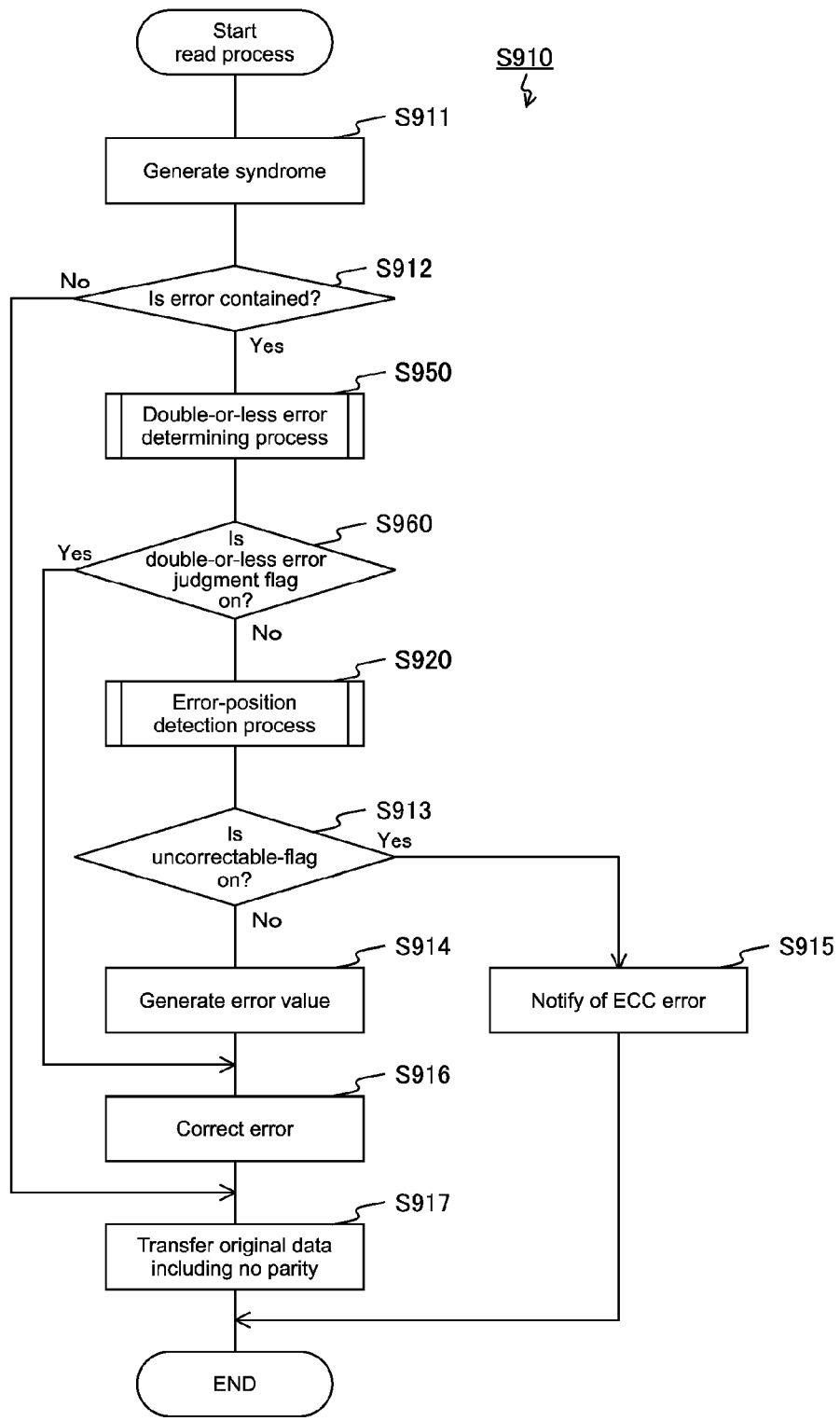
FIG. 27 is a flowchart showing an example of a read process of the fourth embodiment.

FIG. 27 is a flowchart showing an example of the read process of the fourth embodiment. The read process of the third embodiment is different from that of the first embodiment in that it further includes Steps S950 and S960.

If a received word has an error (Step S912: Yes), the memory controller 300 executes a double-or-less error determining process. Specifically, the memory controller 300 determines if the number-of-errors Ne is equal to or less than two or not (Step S950). Then the memory controller 300 determines if the double-or-less error judgment flag has the value "1" (on) or not (Step S960). If the double-or-less error judgment flag is off (Step S960: No), the memory controller 300 executes an error detection process (Step S920).

Meanwhile, if the double-or-less error judgment flag is on (Step S960: Yes), the memory controller 300 corrects an error based on the error position(s) and error value(s) assuming that a single error or a double error has occurred (Step S917).

Figure 28:
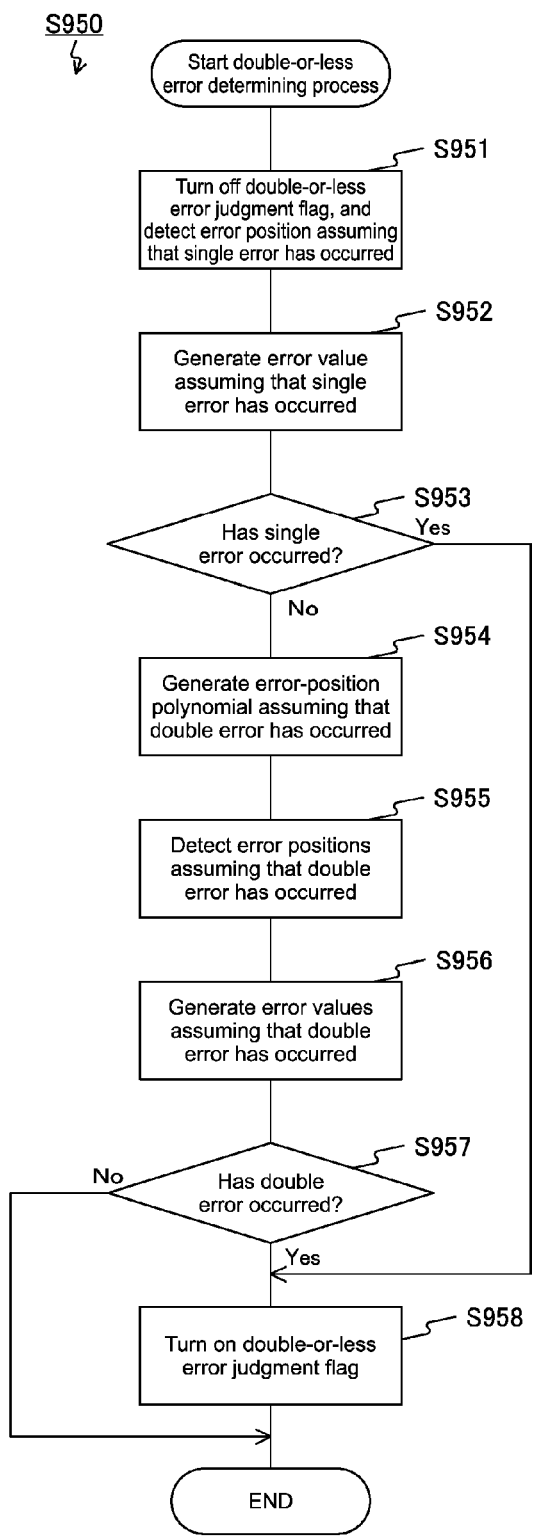
FIG. 28 is a flowchart showing an example of a double-or-less error determining process of the fourth embodiment.

FIG. 28 is a flowchart showing an example of the double-or-less error determining process of the fourth embodiment. The memory controller 300 turns the double-or-less error judgment flag off, and detects an error position assuming that a single error has occurred (Step S951). Then the memory controller 300 generates an error value assuming that a single error has occurred (Step S952). The memory controller 300 determines if a single error has occurred or not by using the mathematical formula 37 (Step S953).

If a single error has not occurred (Step S953: No), the memory controller 300 generates an error-position polynomial assuming that a double error has occurred (Step S954). Then the memory controller 300 detects error positions assuming that a double error has occurred by using a mathematical formula (one of the mathematical formula 17 to the mathematical formula 21) (Step S955). Then the memory controller 300 generates error values assuming that a double error has occurred (Step S956).

The memory controller 300 determines if a double error has occurred or not by using the mathematical formula 39 and the uncorrectable-flag (Step S957). If a single error has occurred (Step S953: Yes) or if a double error has occurred (Step S957: Yes), the memory controller 300 turns a double-or-less error judgment flag on (Step S958).

Meanwhile, if a double error has not occurred (Step S957: No) or after Step S958, the memory controller 300 finishes the double-or-less error determining process.

As described above, according to the fourth embodiment, the decoder 320 detects error positions by using a mathematical formula, and starts Chien search process if the number-of-errors is equal to or less than two. As a result, it is possible to detect an error position/error positions at a high speed if the number-of-errors is equal to or less than two. As a result, the decoder 320 is capable of correcting an error/errors at a high speed if the number-of-errors is equal to or less than two.

Note that the above-mentioned embodiments are examples for realizing the present technology. The matters of those embodiments correspond to the constituent features of the claimed invention, respectively. Similarly, the constituent features of the claimed invention correspond to the matters having the same names of the embodiments of the present technology, respectively. Note that the present technology is not limited to the embodiments. The present technology is realized by variously modifying the embodiments within the gist of the present technology.

Moreover, each procedure described in the above-mentioned embodiments may be a method including the series of procedure. Moreover, each procedure may be a program causing a computer to execute the series of procedure, or a storage medium storing the program. The storage medium may be, for example, a CD (Compact Disc), an MD (Mini Disc), a DVD (Digital Versatile Disc), a memory card, a Blu-ray (registered trademark) Disc, or the like.

Note that the above-mentioned effects are not necessarily limited. Any effect described in the present disclosure may be obtained.

Note that the present technology may employ the following configurations.

(1) An error correcting apparatus, including:
an error-position detector configured
to execute a determination process if a received word fails to satisfy a predetermined condition, the received word having a plurality of symbols, the determination process including determining if a determination-target symbol has an error or not, and
to detect an error position, the error position being a position of the symbol having an error;
a determination-target changing unit configured to change the position of the determination-target symbol of the received word every time the determination process is executed;
an undetected-position detector configured to detect, if the predetermined condition is satisfied, the error position of the symbol, for which the determination process is not executed, based on a relation between the error position and a variable generated from the received word; and
an error corrector configured to correct an error at the error position detected by the error-position detector and the undetected-position detector.

(2) The error correcting apparatus according to (1), further including:
a number-of-detection counter configured to count the number-of-detection based on the result of detecting the error position by the error-position detector, in which
the predetermined condition is the fact that the number-of-detection exceeds a predetermined number.

(3) The error correcting apparatus according to (1), in which
the predetermined condition is the fact that the number of the error position(s) of the symbol(s), for which the determination process is not executed, is less than a predetermined number.

(4) The error correcting apparatus according to any one of (1) to (3), in which
the determination-target changing unit is configured
to determine if the symbol, for which the determination process is not executed, has the error position or not every time the determination process is executed, and to change the position of the determination-target symbol if the symbol has the error position.

(5) The error correcting apparatus according to (4), further including:

a number-of-detection counter configured to count the number-of-detection based on a result of detecting an error position by the error-position detector, in which the predetermined condition is the fact that the number-of-detection exceeds a predetermined number and the position of the determination-target symbol is within a predetermined range at the same time.

(6) The error correcting apparatus according to (4), in which the predetermined condition is the fact that the number of the error position(s) of the symbol(s), for which the determination process is not executed, is less than a predetermined number and the position of the determination-target symbol is within the predetermined range at the same time.

(7) The error correcting apparatus according to any one of (1) to (6), in which the variable is a coefficient of an error-position polynomial, and the undetected-position detector is configured to detect the error position based on a predetermined relation between the coefficient and the error position.

(8) The error correcting apparatus according to (7), in which the undetected-position detector is configured to detect the error position, the error position being denoted by x, x corresponding to each of $y_1$ and $y_2$ in the following mathematical formulae $$y=x(P_2/P_1)$$

$$B=(P_0 \cdot P_2)/(P_1)^2$$

$$y_1=(1/Tr(D)) \cdot \{B \cdot D_2 + (B+B_2) \cdot D\hat{}(2^2) + \ldots + (B+B\hat{}2 + \ldots B\hat{}2^{m-2}) \cdot D\hat{}(2^{m-1})\}$$

$$y_2=y_1+1$$

where

C is D where $Tr(C)=1$ is satisfied in the following mathematical formula $$Tr(C)=C\hat{}2^0+C\hat{}2^1+\ldots+C\hat{}2^{m-1}, \text{ where}$$

an element of an m-th degree extended field $GF(2^m)$ of $GF(2)$ is C, an element of the finite field showing the error position is x, a coefficient of $x^0$ of the error-position polynomial is $P_0$, a coefficient of $x^1$ of the error-position polynomial is $P_1$, and a coefficient of $x^2$ of the error-position polynomial is $P_2$.

(9) The error correcting apparatus according to any one of (1) to (8), further including:

a variable storage configured to store the variable generated from the received word; and a variable updating unit configured to update the variable based on the detected error position every time the error position is detected.

(10) The error correcting apparatus according to (9), in which the variable updating unit is configured to update, if the position of the determination-target symbol is within a predetermined range, the variable based on the detected error position every time the error position is detected.

(11) The error correcting apparatus according to (9), in which the variable updating unit is configured to determine, every time the error position is detected, if the number of the error position of the symbol, for which the determination process is not executed by the error-position detector, is one or not, and to update the variable if the number is not one, and the undetected-position detector is configured to detect, if the number is one, the error position based on a relation between the updated variable and the error position.

(12) The error correcting apparatus according to any one of (1) to (11), further including:

a syndrome storage configured to store a vector generated from the received word as a syndrome;

a syndrome updating unit configured to update the stored syndrome based on the detected error position every time the error position is detected; and a variable generator configured to generate the variable from the stored syndrome, and to supply the variable to the undetected-position detector.

(13) The error correcting apparatus according to any one of (1) to (11), further including:

a first error-position polynomial generator configured to generate a first error-position polynomial from the received word;

a multiplier configured to initialize a second error-position polynomial, and to multiply the second error-position polynomial by a linear polynomial every time the error position is detected, the linear polynomial showing the error position, to thereby update the second error-position polynomial; and a divider configured to divide, if the predetermined condition is satisfied, the first error-position polynomial by the second error-position polynomial, and to supply a coefficient of a polynomial generated by the division to the undetected-position detector as the variable.

(14) The error correcting apparatus according to any one of (1) to (13), further including:

a number-of-errors determining unit configured to detect the error position based on a relation between the error position and the variable generated from the received word, and to determine if the number-of-errors exceeds a predetermined value or not, the number-of-errors being the number of the detected error position(s), in which the error-position detector is configured to detect the error position(s) if the number-of-errors exceeds the predetermined value or if the predetermined condition is not satisfied.

(15) The error correcting apparatus according to any one of (1) to (13), in which the error-position detector is configured to execute the determination process for a plurality of determination-target symbols, and the determination-target changing unit is configured to change a position of each of the plurality of determination-target symbols every time the determination process is executed for each position of the plurality of determination-target symbols.

(16) The error correcting apparatus according to any one of (1) to (15), further including:

an error value generator configured to generate an error value from the detected error position, in which the received word is one of an RS (Reed-Solomon) code, and a received word corresponding to a code word of a BCH code with q ($=2^m$) unknowns, where m is an integer equal to or more than two, and the error corrector is configured to correct the error by using the error value at the error position detected by the error-position detector and the undetected-position detector.

(17) The error correcting apparatus according to any one of (1) to (15), in which the received word is a received word corresponding to a code word of a binary BCH (Bose-Chaudhuri-Hocquenghem) code, and the error corrector is configured to invert a value of the symbol at the error position.

(18) An error correcting method, including:

executing, by an error-position detector, a determination process if a received word fails to satisfy a predetermined condition, the received word having a plurality of symbols, the determination process including determining if a determination-target symbol has an error or not, and detecting an error position, the error position being a position of the symbol having an error;

changing, by a determination-target changing unit, the position of the determination-target symbol of the received word every time the determination process is executed;

detecting, by an undetected-position detector, if the predetermined condition is satisfied, the error position of the symbol, for which the determination process is not executed, based on a relation between the error position and a variable generated from the received word; and correcting, by an error corrector, an error at the error position detected by the error-position detector and the undetected-position detector.

(19) A program, causing a computer to function as:

an error-position detector configured to execute a determination process if a received word fails to satisfy a predetermined condition, the received word having a plurality of symbols, the determination process including determining if a determination-target symbol has an error or not, and to detect an error position, the error position being a position of the symbol having an error;

a determination-target changing unit configured to change the position of the determination-target symbol of the received word every time the determination process is executed;

an undetected-position detector configured to detect, if the predetermined condition is satisfied, the error position of the symbol, for which the determination process is not executed, based on a relation between the error position and a variable generated from the received word; and an error corrector configured to correct an error at the error position detected by the error-position detector and the undetected-position detector.

It should be understood by those skilled in the art that various modifications, combinations, sub-combinations and alterations may occur depending on design requirements and other factors insofar as they are within the scope of the appended claims or the equivalents thereof.

What is claimed is:

1. An error correcting apparatus, comprising:
an error-position detector configured
to execute a determination process if a received word fails to satisfy a predetermined condition, the received word having a plurality of symbols, the determination process including determining if a determination-target symbol has an error or not, and
to detect an error position, the error position being a position of the symbol having an error;
a determination-target changing unit configured to change the position of the determination-target symbol of the received word every time the determination process is executed;
an undetected-position detector configured to detect, if the predetermined condition is satisfied, the error position of the symbol, for which the determination process is not executed, based on a relation between the error position and a variable generated from the received word; and
an error corrector configured to correct an error at the error position detected by the error-position detector and the undetected-position detector.

2. The error correcting apparatus according to claim 1, further comprising:
a number-of-detection counter configured to count the number-of-detection based on the result of detecting the error position by the error-position detector, wherein
the predetermined condition is the fact that the number-of-detection exceeds a predetermined number.

3. The error correcting apparatus according to claim 1, wherein
the predetermined condition is the fact that the number of the error position(s) of the symbol(s), for which the determination process is not executed, is less than a predetermined number.

4. The error correcting apparatus according to claim 1, wherein
the determination-target changing unit is configured
to determine if the symbol, for which the determination process is not executed, has the error position or not every time the determination process is executed, and
to change the position of the determination-target symbol if the symbol has the error position.

5. The error correcting apparatus according to claim 4, further comprising:
a number-of-detection counter configured to count the number-of-detection based on a result of detecting an error position by the error-position detector, wherein
the predetermined condition is the fact that the number-of-detection exceeds a predetermined number and the position of the determination-target symbol is within a predetermined range at the same time.

6. The error correcting apparatus according to claim 4, wherein
the predetermined condition is the fact that the number of the error position(s) of the symbol(s), for which the determination process is not executed, is less than a predetermined number and the position of the determination-target symbol is within the predetermined range at the same time.

7. The error correcting apparatus according to claim 1, wherein
the variable is a coefficient of an error-position polynomial, and
the undetected-position detector is configured to detect the error position based on a predetermined relation between the coefficient and the error position.

8. The error correcting apparatus according to claim 7, wherein the undetected-position detector is configured to detect the error position, the error position being denoted by x, x corresponding to each of $y_1$ and $y_2$ in the following mathematical formulae $$y = x(P_2/P_1)$$

$$B = (P_0 \cdot P_2)/(P_1)^2$$

$$y_1 = (1/Tr(D)) \cdot \{B \cdot D_2 + (B+B_2) \cdot D\hat{}(2^2) + \ldots + (B+B\hat{}2 + \ldots B\hat{}2^{m-2}) \cdot D\hat{}(2^{m-1})\}$$

$$y_2 = y_1 + 1$$

where
C is D where $Tr(C) = 1$ is satisfied in the following mathematical formula $$Tr(C) = C\hat{}2^0 + C\hat{}2^1 + \ldots + C\hat{}2^{m-1}, \text{ where}$$

an element of an m-th degree extended field $GF(2^m)$ of $GF(2)$ is C,
an element of the finite field showing the error position is x,
a coefficient of $x^0$ of the error-position polynomial is $P_0$,
a coefficient of $x^1$ of the error-position polynomial is $P_1$, and
a coefficient of $x^2$ of the error-position polynomial is $P_2$.

9. The error correcting apparatus according to claim 1, further comprising:
a variable storage configured to store the variable generated from the received word; and
a variable updating unit configured to update the variable based on the detected error position every time the error position is detected.

10. The error correcting apparatus according to claim 9, wherein
the variable updating unit is configured to update, if the position of the determination-target symbol is within a predetermined range, the variable based on the detected error position every time the error position is detected.

11. The error correcting apparatus according to claim 9, wherein
the variable updating unit is configured
to determine, every time the error position is detected, if the number of the error position of the symbol, for which the determination process is not executed by the error-position detector, is one or not, and
to update the variable if the number is not one, and
the undetected-position detector is configured to detect, if the number is one, the error position based on a relation between the updated variable and the error position.

12. The error correcting apparatus according to claim 1, further comprising:
a syndrome storage configured to store a vector generated from the received word as a syndrome;
a syndrome updating unit configured to update the stored syndrome based on the detected error position every time the error position is detected; and
a variable generator configured
to generate the variable from the stored syndrome, and
to supply the variable to the undetected-position detector.

13. The error correcting apparatus according to claim 1, further comprising:
a first error-position polynomial generator configured to generate a first error-position polynomial from the received word;
a multiplier configured
to initialize a second error-position polynomial, and
to multiply the second error-position polynomial by a linear polynomial every time the error position is detected, the linear polynomial showing the error position, to thereby update the second error-position polynomial; and
a divider configured
to divide, if the predetermined condition is satisfied, the first error-position polynomial by the second error-position polynomial, and
to supply a coefficient of a polynomial generated by the division to the undetected-position detector as the variable.

14. The error correcting apparatus according to claim 1, further comprising:
a number-of-errors determining unit configured
to detect the error position based on a relation between the error position and the variable generated from the received word, and
to determine if the number-of-errors exceeds a predetermined value or not, the number-of-errors being the number of the detected error position(s), wherein
the error-position detector is configured to detect the error position(s) if the number-of-errors exceeds the predetermined value or if the predetermined condition is not satisfied.

15. The error correcting apparatus according to claim 1, wherein
the error-position detector is configured to execute the determination process for a plurality of determination-target symbols, and
the determination-target changing unit is configured to change a position of each of the plurality of determination-target symbols every time the determination process is executed for each position of the plurality of determination-target symbols.

16. The error correcting apparatus according to claim 1, further comprising:
an error value generator configured to generate an error value from the detected error position, wherein
the received word is one of an RS (Reed-Solomon) code, and a received word corresponding to a code word of a BCH code with q $(=2^m)$ unknowns, where m is an integer equal to or more than two, and
the error corrector is configured to correct the error by using the error value at the error position detected by the error-position detector and the undetected-position detector.

17. The error correcting apparatus according to claim 1, wherein
the received word is a received word corresponding to a code word of a binary BCH (Bose-Chaudhuri-Hocquenghem) code, and
the error corrector is configured to invert a value of the symbol at the error position.

18. An error correcting method, comprising:
executing, by an error-position detector, a determination process if a received word fails to satisfy a predetermined condition, the received word having a plurality of symbols, the determination process including determining if a determination-target symbol has an error or not, and detecting an error position, the error position being a position of the symbol having an error;
changing, by a determination-target changing unit, the position of the determination-target symbol of the received word every time the determination process is executed;

detecting, by an undetected-position detector, if the predetermined condition is satisfied, the error position of the symbol, for which the determination process is not executed, based on a relation between the error position and a variable generated from the received word; and correcting, by an error corrector, an error at the error position detected by the error-position detector and the undetected-position detector.

19. A non-transitory computer-readable medium storing instructions which, when executed by a processor of a computer, cause the computer to function as:

an error-position detector configured
- to execute a determination process if a received word fails to satisfy a predetermined condition, the received word having a plurality of symbols, the determination process including determining if a determination-target symbol has an error or not, and
- to detect an error position, the error position being a position of the symbol having an error;

a determination-target changing unit configured to change the position of the determination-target symbol of the received word every time the determination process is executed;

an undetected-position detector configured to detect, if the predetermined condition is satisfied, the error position of the symbol, for which the determination process is not executed, based on a relation between the error position and a variable generated from the received word; and an error corrector configured to correct an error at the error position detected by the error-position detector and the undetected-position detector.

\* \* \* \* \*